(12) United States Patent
Manipatruni et al.

(10) Patent No.: US 11,264,558 B2
(45) Date of Patent: Mar. 1, 2022

(54) NANO-ROD SPIN ORBIT COUPLING BASED MAGNETIC RANDOM ACCESS MEMORY WITH SHAPE INDUCED PERPENDICULAR MAGNETIC ANISOTROPY

(71) Applicant: Intel Corporation, Santa Clara, CA (US)

(72) Inventors: Sasikanth Manipatruni, Portland, OR (US); Kaan Oguz, Portland, OR (US); Chia-Ching Lin, Portland, OR (US); Christopher Wiegand, Portland, OR (US); Tanay Gosavi, Hillsboro, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 660 days.

(21) Appl. No.: 16/128,426

(22) Filed: Sep. 11, 2018

(65) Prior Publication Data

US 2020/0083427 A1 Mar. 12, 2020

(51) Int. Cl.
| | |
|---|---|
| *H01L 43/02* | (2006.01) |
| *H01F 10/32* | (2006.01) |
| *G11C 11/16* | (2006.01) |
| *H01L 43/10* | (2006.01) |
| *H01L 27/22* | (2006.01) |

(52) U.S. Cl.
CPC ............ *H01L 43/02* (2013.01); *G11C 11/161* (2013.01); *H01F 10/329* (2013.01); *H01F 10/3268* (2013.01); *H01F 10/3286* (2013.01); *H01L 27/228* (2013.01); *H01L 43/10* (2013.01)

(58) Field of Classification Search
CPC ....... H01L 43/02; H01L 43/10; H01L 27/228; G11C 11/161; H01F 10/3268; H01F 10/3286; H01F 10/329
USPC ...................................................... 257/421
See application file for complete search history.

(56) References Cited

U.S. PATENT DOCUMENTS

| 8,482,970 B2 * | 7/2013 | Dimitrov .............. H01F 10/329 365/158 |
|---|---|---|
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |

(Continued)

*Primary Examiner* — Tu-Tu V Ho
(74) *Attorney, Agent, or Firm* — Essential Patents Group, LLP

(57) ABSTRACT

An apparatus is provided which comprises: a magnetic junction including: a stack of structures including: a first structure comprising a magnet with an unfixed perpendicular magnetic anisotropy (PMA) relative to an x-y plane of a device, wherein the first structure has a first dimension along the x-y plane and a second dimension in the z-plane, wherein the second dimension is substantially greater than the first dimension. The magnetic junction includes a second structure comprising one of a dielectric or metal; and a third structure comprising a magnet with fixed PMA, wherein the third structure has an anisotropy axis perpendicular to the plane of the device, and wherein the third structure is adjacent to the second structure such that the second structure is between the first and third structures; and an interconnect adjacent to the third structure, wherein the interconnect comprises a spin orbit material.

23 Claims, 24 Drawing Sheets

(56) References Cited

U.S. PATENT DOCUMENTS

| | | |
|---|---|---|
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

\* cited by examiner

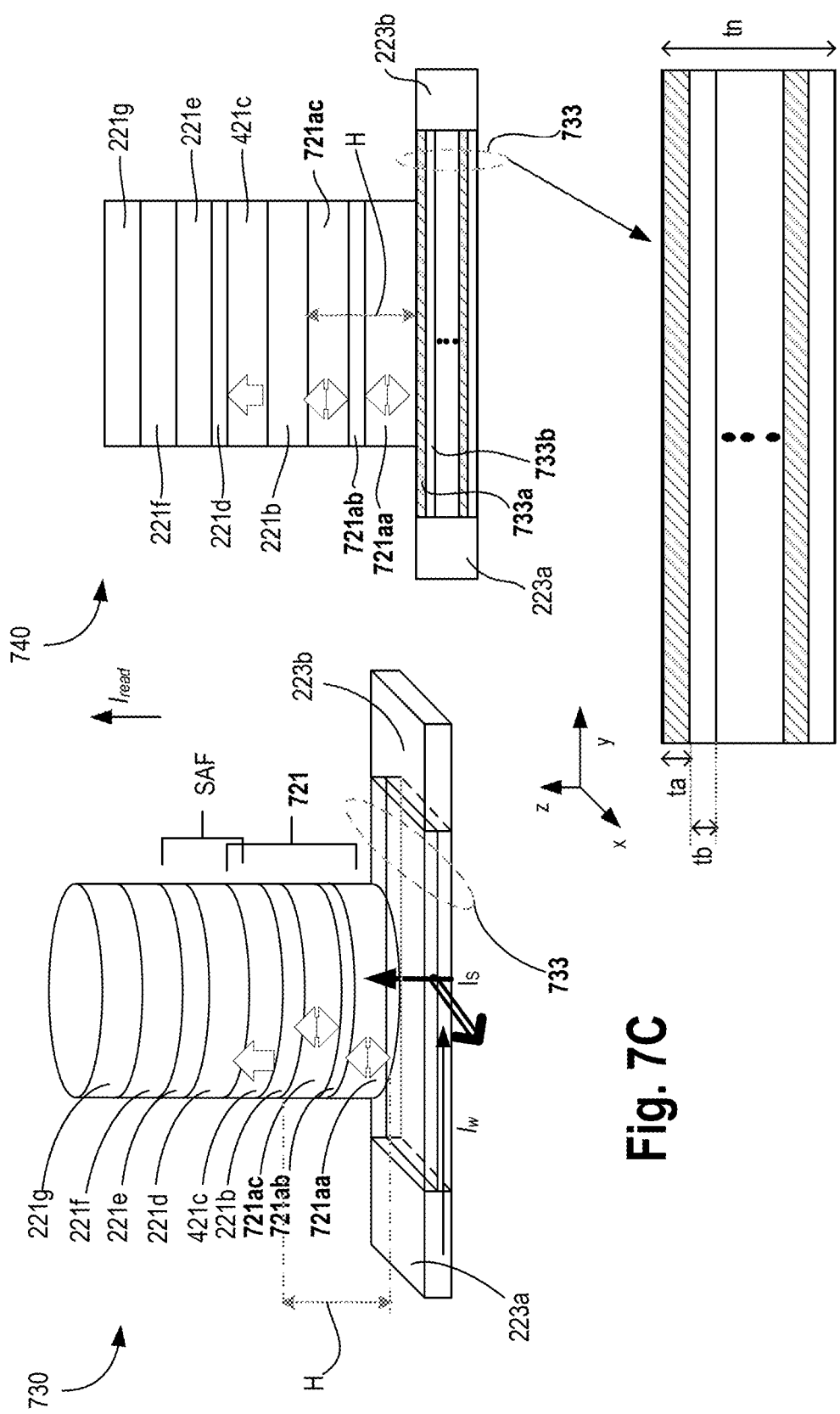

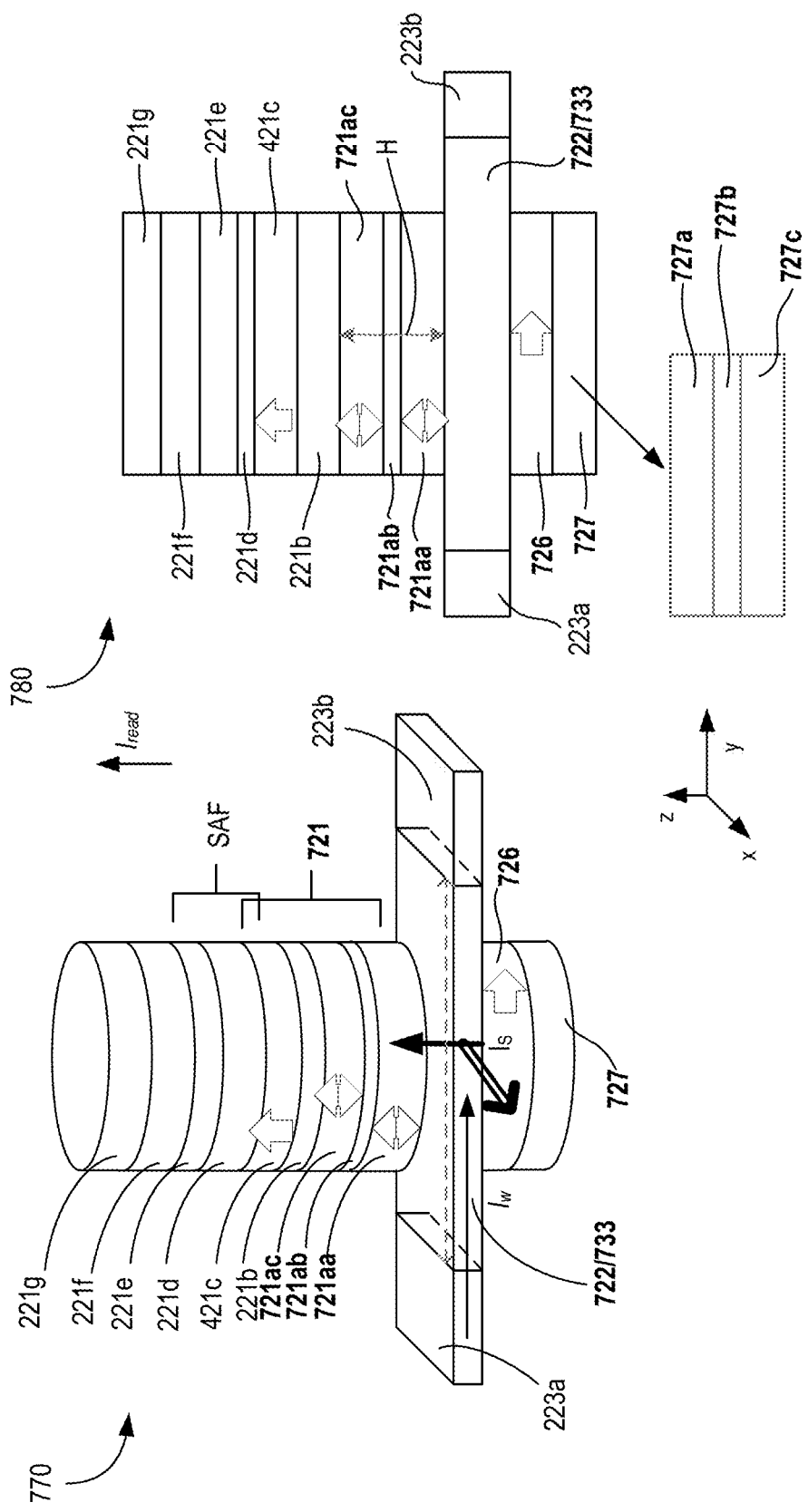

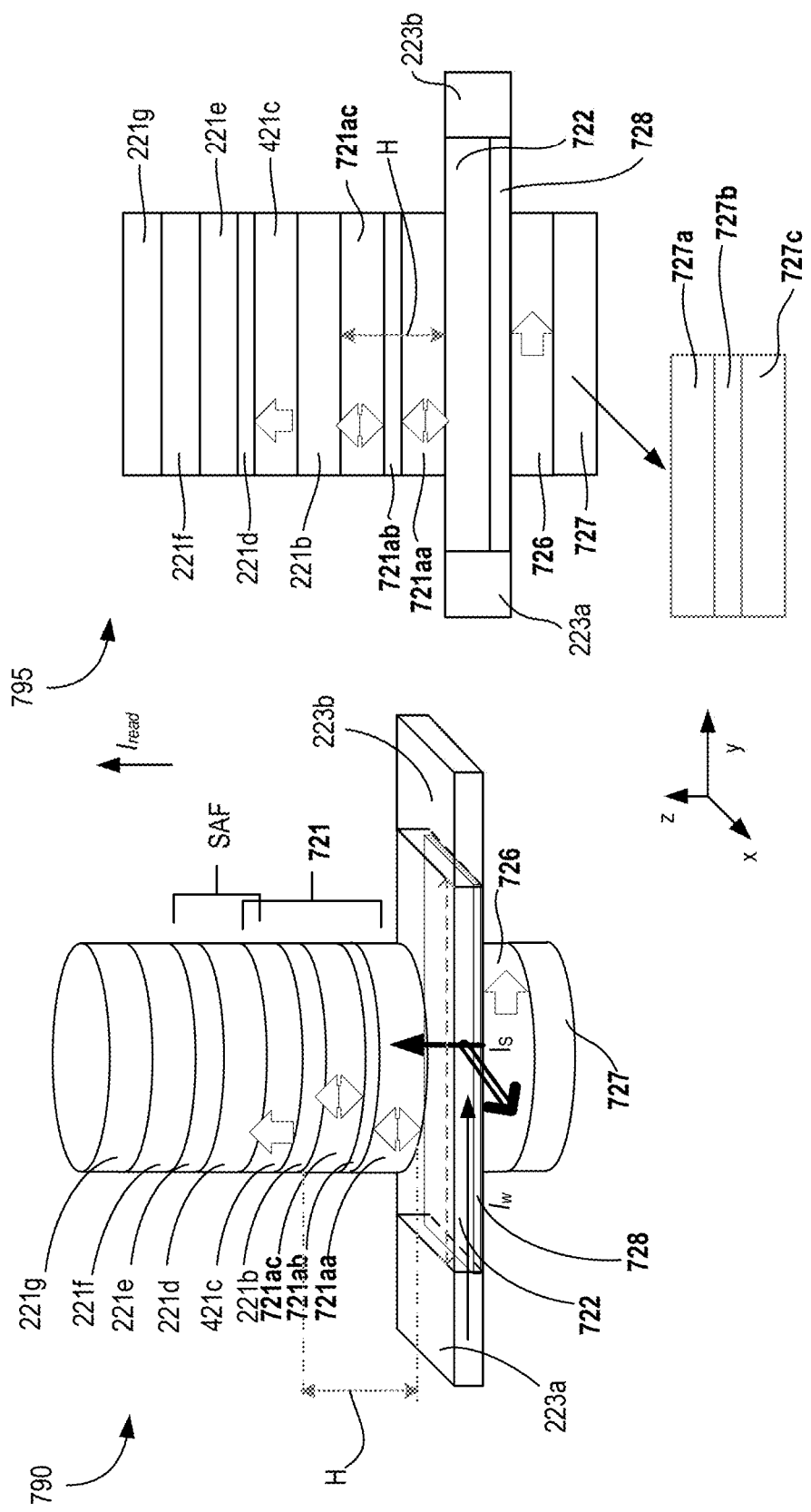

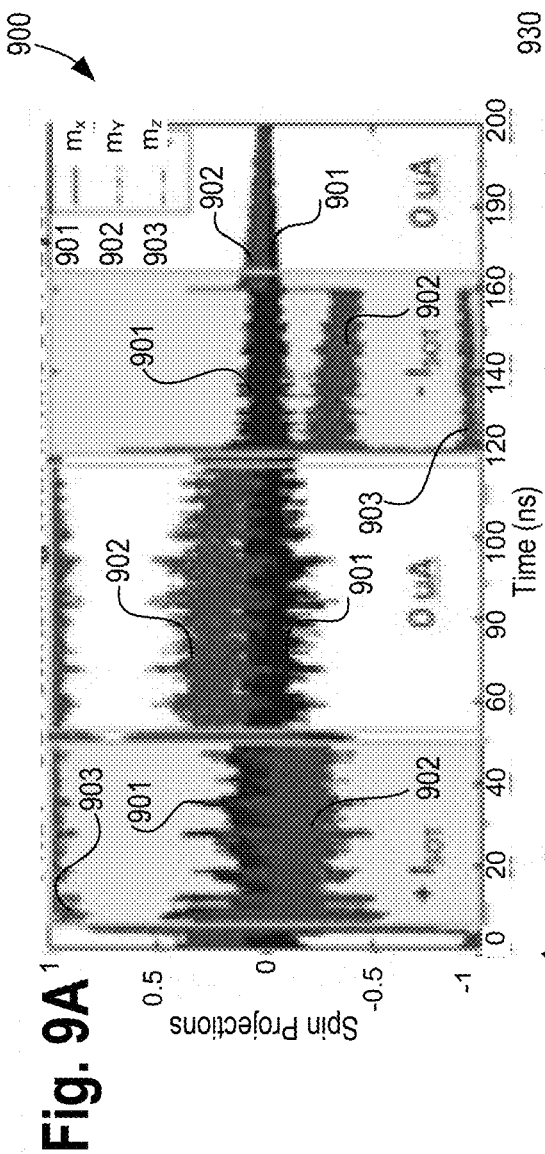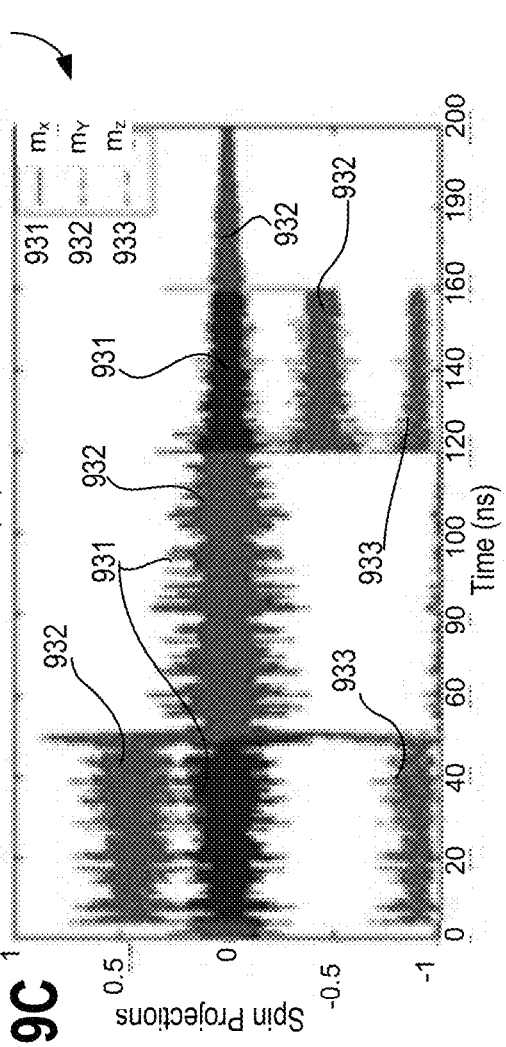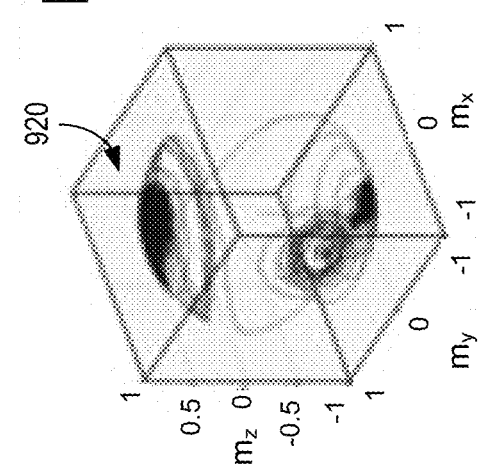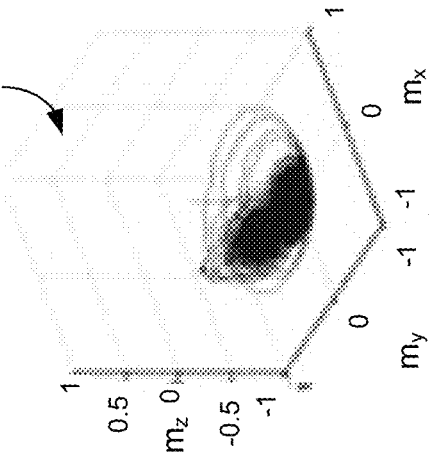

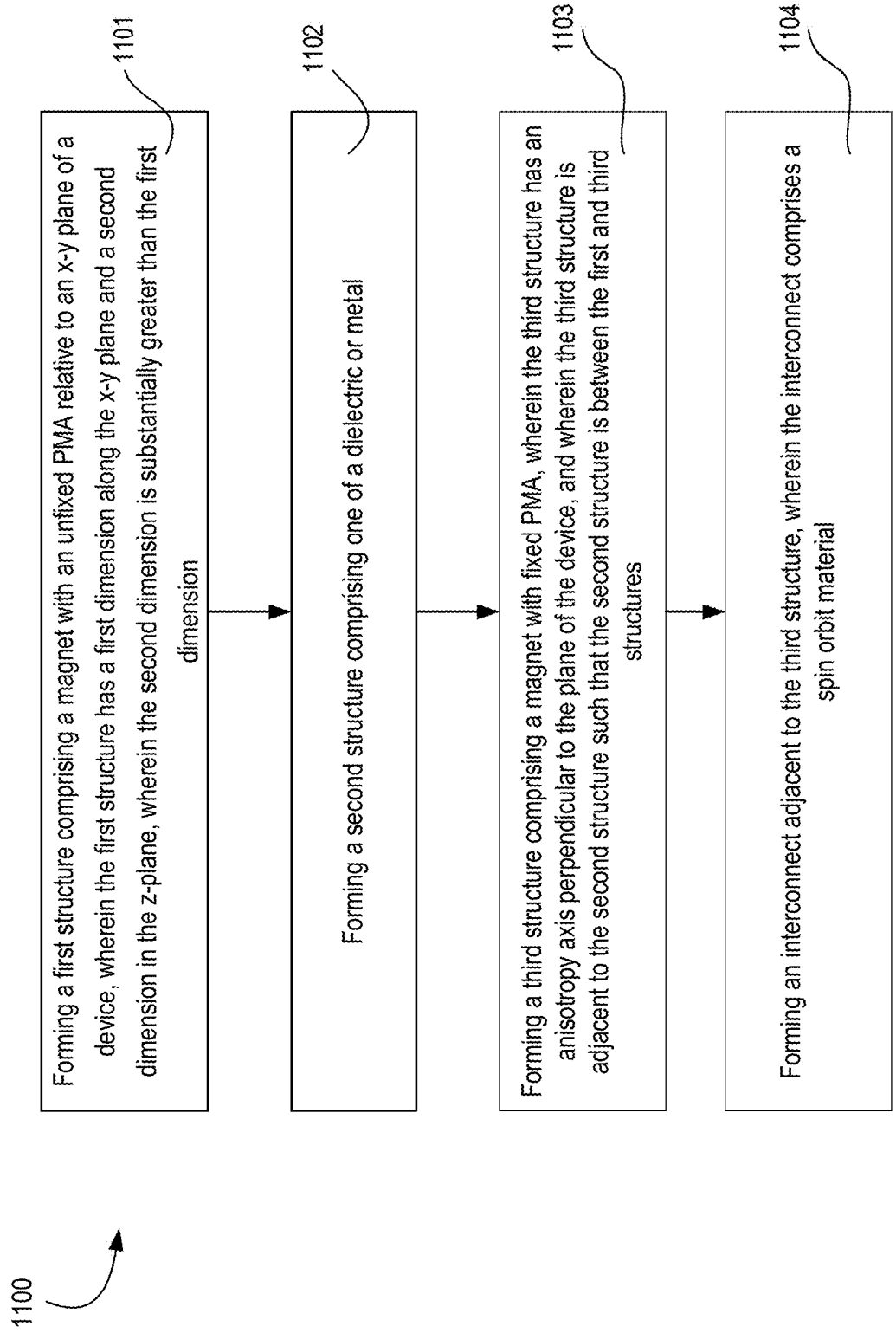

NANO-ROD SPIN ORBIT COUPLING BASED MAGNETIC RANDOM ACCESS MEMORY WITH SHAPE INDUCED PERPENDICULAR MAGNETIC ANISOTROPY

BACKGROUND

Embedded memory with state retention can enable energy and computational efficiency. However, leading spintronic memory options, for example, spin transfer torque based magnetic random access memory (STT-MRAM), suffer from the problem of high voltage and high write current during the programming (e.g., writing) of a bit-cell. For instance, large write current (e.g., greater than 100 μA) and voltage (e.g., greater than 0.7 V) are required to write a tunnel junction based magnetic tunnel junction (MTJ). Limited write current also leads to high write error rates or slow switching times (e.g., exceeding 20 ns) in MTJ based MRAM. The presence of a large current flowing through a tunnel barrier leads to reliability issues in magnetic tunnel junctions.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 7C-D illustrate a 3D view and corresponding cross-section view, respectively, of a device having a magnetic junction with magnets having perpendicular magnetizations, where the free magnet has a thickness substantially greater than a width of the free magnet, according to some embodiments of the disclosure.

FIGS. 7G-H illustrate a 3D view and corresponding cross-section view, respectively, of a device having a magnetic junction with magnets having perpendicular magnetizations, where the free magnet has a thickness substantially greater than a width of the free magnet, and a via comprising an in-plane magnet and an AFM, one of which is adjacent to the spin orbit torque (SOT) and antiferromagnetic (AFM) interconnect, according to some embodiments of the disclosure.

FIGS. 7I-J illustrate a 3D view and corresponding cross-section view, respectively, of a device having a magnetic junction with magnets having perpendicular magnetizations, where the free magnet has a thickness substantially greater than a width of the free magnet, and a via comprising an in-plane magnet which is adjacent to the AFM, according to some embodiments of the disclosure.

FIG. 9A illustrates a plot showing spin polarization capturing switching of a free magnet structure which is exchanged coupled or biased by a magnetic via under an SOT/AFM interconnect, according to some embodiments of the disclosure.

FIG. 9B illustrates a magnetization plot associated with FIG. 9A, according to some embodiments of the disclosure.

FIG. 9C illustrates a plot showing spin polarization capturing switching of the free magnet structure which is exchanged coupled or biased by a magnetic via under an SOT/AFM interconnect, according to some embodiments of the disclosure.

FIG. 9D illustrates a magnetization plot associated with FIG. 9C, according to some embodiments of the disclosure.

FIG. 11 illustrates a flowchart of a method for forming a device of FIGS. 2, and 7-8, in accordance with some embodiments.

DETAILED DESCRIPTION

Figure 1A:
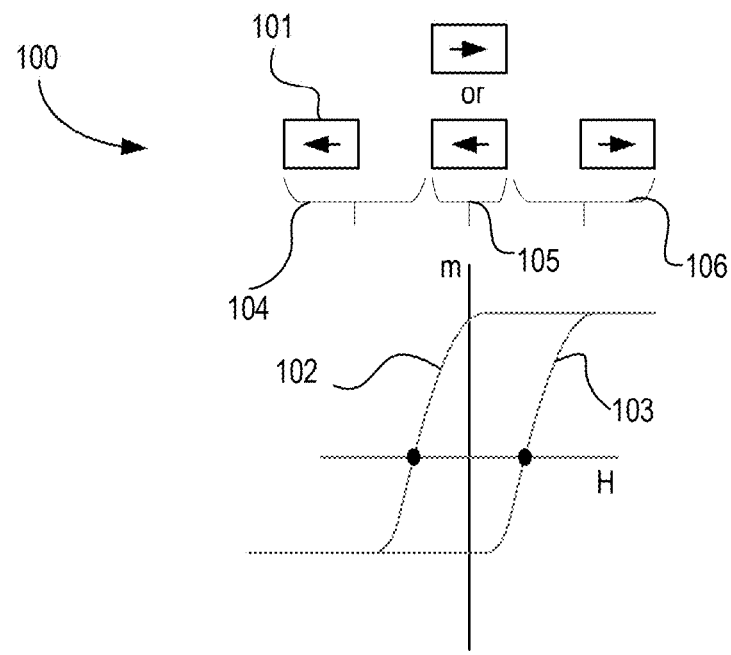
FIG. 1A illustrates a magnetization response to an applied magnetic field for a ferromagnet.

Perpendicular Spin Orbit Torque (PSOT) MRAM uses spin orbit torque (SOT), also referred to as Spin Orbit Coupling (SOC), from heavy metal, two-dimensional (2D) material, Antiferromagnets (AFM), or topological insulator(s) (TI) to switch the perpendicular magnet coupled to an SOT electrode. Typically, in-plane magnetic field through the SOT electrode is used for deterministic bidirectional switching of the free magnet of the PSOT MRAM. This in-plane magnetic field can be generated by AFM materials as SOT electrode or magnetically doped heavy metal electrode or magnetic via or by designing a complex free magnet layer stack.

Antiferromagnetic materials such as triangular, chiral, hexagonal, Kagomi, and/or cubic show a huge promise for being used as an SOT electrode layer in PSOT devices. AFM materials have large spin orbit torques and can apply in-plane bias magnetic field to the free magnet layer of the PSOT device using the interfacial exchange bias effect. The in-plane magnetic field from the exchange bias is one of the ways by which symmetry can be broken for achieving repeatable and deterministic bidirectional switching of the PSOT MRAM.

As PSOT MRAM based bit-cells are scaled down in area (e.g., when memory is scaled beyond 20 nm dimension), maintaining the stability of the PSOT MRAM bit-cell becomes a challenge. It is describable to decouple the write path from the read path for the bit-cell, which allows for low programming voltages using spin Hall effect and faster read latencies. Materials that provide spin Hall effect can also provide high spin injection efficiency. One way to address the problem of stability as the area of the PSOT MRAM is scaled down, is to use multi-layered complex magnets and engineering interfacial perpendicular magnetic anisotropy by using materials such as W or Pt between the magnetic layers. However, such a method is limiting as it increases the complexity of the magnetic stack and the fabrication steps, which in turn can adversely affect the tunneling magneto-resistance (TMR), yield, and reliability of the memory. The multilayer structure has competing issues to maintain high efficiency of the memory device while meeting the stability requirements.

Some embodiments use shape anisotropy to increase the stability of perpendicular magnetic anisotropy (PMA) magnets instead of solely relying on engineering interfacial perpendicular magnetic anisotropy by using materials such as W or Pt between the magnetic layers. As the MRAM bit-cells scale (e.g., the lateral dimension in magnetic tunneling junctions (MTJs) scale down below 20 nanometers), shape anisotropy is used to make tall magnetic structures (e.g., in the range of 10 to 50 nanometers) that have high stability due to shape. These tall magnetic structures are also referred to as nano-rods. The tall magnetic structures can be a single layer with one or more materials or multiple layers with different materials.

There are many technical effects of the various embodiments. For example, in some embodiments, the out-of-plane magnetization switching enables perpendicular magnet anisotropy (PMA) based magnetic devices (e.g., MRAM and logic) comprising spin orbit effects that generate perpendicular spin currents. The perpendicular magnet switch of some embodiments enables low programming voltages (or higher current for identical voltages) enabled by giant spin orbit effects (GSOE) for perpendicular magnetic memory and logic. The perpendicular magnet switch, of some embodiments, results in lower write error rates which enable faster MRAM (e.g., write time of less than 10 ns). The perpendicular magnet switch of some embodiments decouples write and read paths to enable faster read latencies. The perpendicular magnet switch of some embodiments uses significantly smaller read current through the magnetic junction (e.g., MTJ or spin valve) and provides improved reliability of the tunneling oxide and MTJs. For example, less than 10 µA compared to 100 µA for nominal write is used by the perpendicular magnet switch of some embodiments.

The use of shape anisotropy allows the use of high efficiency magnetic materials (e.g., CoFe, and FeB) with low damping to be applied as the free layer in the MTJ. The use of shape anisotropy to provide PMA for the magnet simplifies the fabrication and/or integration process, and also enables scaling of the MTJ to extreme dimension (e.g., diameters at 5 nanometers or lower) while enabling high stability of the non-volatile memory state. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described, but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetizations. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

Figure 1B:
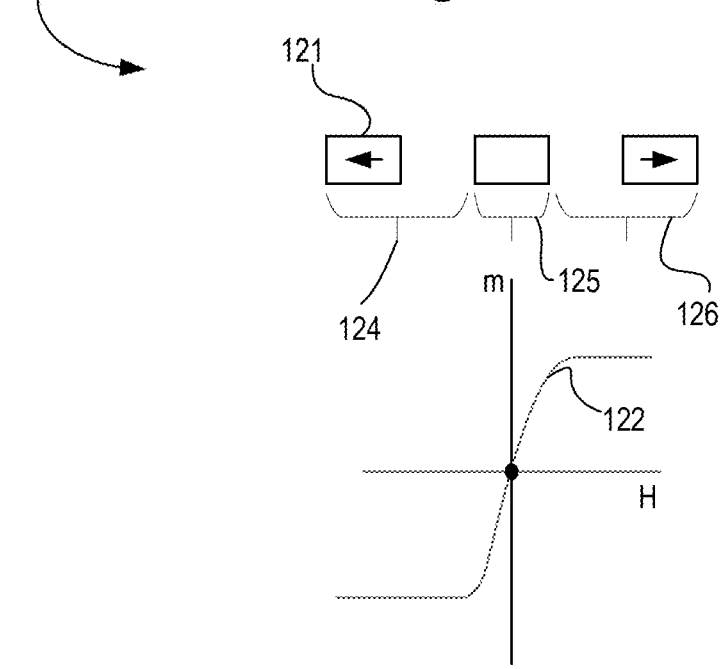
FIG. 1B illustrates a magnetization response to an applied magnetic field for a paramagnet.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum(Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either an FM or a paramagnet.

Figure 2:
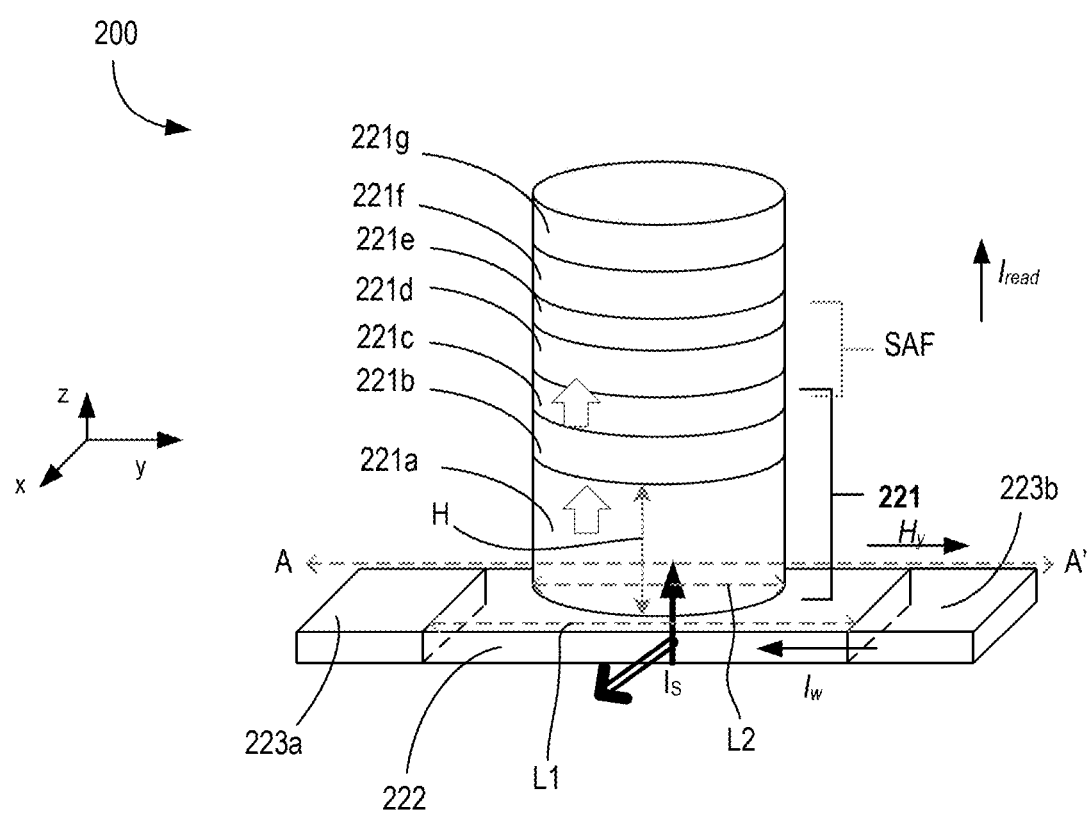
FIG. 2 illustrates a three-dimensional (3D) view of a device having an out-of-plane magnetic tunnel junction (MTJ) stack comprising a nano-rod coupled to a spin orbit coupling (SOC) interconnect, in accordance with some embodiments.

FIG. 2 illustrates a three-dimensional (3D) view of a device having an out-of-plane magnetic tunnel junction (MTJ) stack comprising a nano-rod coupled to a spin orbit coupling (SOC) interconnect, in accordance with some embodiments.

Here, the stack of layers having magnetic junction 221 is coupled to an electrode 222 comprising spin Hall effect (SHE) or SOC material (or spin orbit torque (SOT) material), where the SHE material converts charge current $I_W$ (or write current) to spin polarized current $I_S$. The device of FIG. 2 forms a three-terminal memory cell with SHE induced write mechanism and MTJ based read-out. Spin Hall effect is a relativistic spin-orbit coupling phenomenon that can be used to electrically generate or detect spin currents in non-magnetic systems.

When an in-plane current is applied to heavy-metal/ferromagnet bilayer systems, this in-plane current gives rise to spin accumulation in the ferromagnet via spin-orbit interactions. The spin accumulation in the free ferromagnet leads to torques (e.g., SOT) or effective fields acting on the magnetization, thus switching the magnetization of the free ferromagnet. The SOT has two components with different symmetries—Slonczewski-like torque and field-like torque. The origin of the SOT is generally attributed to the bulk spin Hall effect in the heavy metal. The specific structures of the SOT switching scheme demonstrated here are categorized into two types according to the direction of the easy axis of the ferromagnet. Here the easy axis is perpendicular to the film plane (or device).

The device of FIG. 2 comprises magnetic junction 221, SHE interconnect or electrode 222, and non-magnetic metal(s) 223a/b. In one example, MTJ 221 comprises layers 221a, 221b, and 221c. In some embodiments, layers 221a and 221c are ferromagnetic layers. In some embodiments, layer 221b is a metal or a tunneling dielectric.

For example, when the magnetic junction is a spin valve, layer 221b is metal or a metal oxide (e.g., a non-magnetic metal such as Al and/or its oxide) and when the magnetic junction is a tunneling junction, then layer 221b is a dielectric (e.g. MgO, $Al_2O_3$). One or both ends along the horizontal direction of SHE interconnect 222 is formed of non-magnetic metals 223a/b. Additional layers 221d, 221e, 221f, and 221g can also be stacked on top of layer 221c. In some embodiments, layer 221g is a non-magnetic metal electrode.

So as not to obscure the various embodiments, the magnetic junction is described as a magnetic tunneling junction (MTJ). However, the embodiments are also applicable for spin valves. A wide combination of materials can be used for material stacking of magnetic junction 221. For example, the stack of layers 221a, 221b, 221c, 221d, 221e, 221f, and 221g are formed of materials which include: $Co_xFe_yBz$, MgO, $Co_xFe_yB_z$, Ru, $Co_xFe_yB_z$, IrMn, and Ru, respectively, where 'x,' 'y,' and 'z' are fractions of elements in the alloys. Other materials may also be used to form MTJ 221. MTJ 221 stack comprises free magnetic layer 221a, MgO tunneling oxide 221b, a fixed magnetic layer 221c/d/e which is a combination of CoFe, Ru, and CoFe layers, respectively, referred to as Synthetic Anti-Ferromagnet (SAF), and an Anti-Ferromagnet (AFM) layer 221f. The SAF layer has the property, that the magnetizations in the two CoFe layers are opposite, and allows for cancelling the dipole fields around the free magnetic layer such that a stray dipole field will not control the free magnetic layer.

In some embodiments, the free and fixed magnetic layers (221a and 221c, respectively) are ferromagnets (FMs) that are formed of CFGG (i.e., Cobalt (Co), Iron (Fe), Germanium (Ge), or Gallium (Ga) or a combination of them). In some embodiments, FM 221a/c are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, the magnets with PMA comprise a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; materials with $L1_0$ symmetry; and materials with tetragonal crystal structure. In some embodiments, the magnet with PMA is formed of a single layer of one or more materials. In some embodiments, the single layer is formed of MnGa.

$L1_0$ is a crystallographic derivative structure of an FCC (face centered cubic lattice) structure and has two of the faces occupied by one type of atom and the corner and the other face occupied with the second type of atom. When phases with the $L1_0$ structure are ferromagnetic the magnetization vector usually is along the [0 0 1] axis of the crystal. Examples of materials with $L1_0$ symmetry include CoPt and FePt. Examples of materials with tetragonal crystal structure and magnetic moment are Heusler alloys such as CoFeAl, MnGe, MnGeGa, and MnGa.

In some embodiments, the magnets 221a and/or 221c can be a combination of ferromagnets or paramagnets. For example, magnet 221a is a ferromagnet while magnet 221c is a paramagnet. In another example, magnet 221c is a ferromagnet while magnet 221a is a paramagnet. In some embodiments, magnets 221a and/or 221c are paramagnets.

The thickness of a ferromagnetic layer (e.g., fixed or free magnetic layer) may determine its equilibrium magnetization direction. For example, when the thickness of the ferromagnetic layer 221a/c is below a certain threshold (depending on the material of the magnet), the ferromagnetic layer 221a/c exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or $L1_0$-type of crystals, where $L1_0$ is a type of crystal class which exhibits perpendicular magnetizations), can also determine the direction of magnetization.

Stability of the device of FIG. 2 becomes an issue as the device is scaled down in area. For example, when diameter L2 of free magnet 221a is reduced in the range of 5 nm to 20 nm, surface or interface anisotropy may not provide a stable magnetization. For example, the magnetization of free layer 221a may flip unexpectedly causing the device of FIG. 2 to become non-functional. As such, surface anisotropy alone may not be effective to stabilize the magnetization behavior of free layer 221a. In various embodiments, shape anisotropy is used to increase the stability of the PMA free magnet 221a. The same concept can also be applied to the fixed magnet 221c, in accordance with some embodiments.

To stabilize the device of FIG. 2 such that the free magnet 221a does not flip unexpectedly when device of FIG. 2 is scaled down, free magnet 221a is made taller. For example, the free magnet 221a is made longer in the z-direction relative to the x-y direction. The longer structure of the free magnet results in a nano-rod. In one example, the height H of free magnet 221a is in the range of 10 to 50 nm, and is substantially larger than the width L2 of free magnet 221a. Using shape anisotropy to stabilize free magnet 221a enables the use of high efficiency and low damping magnet materials such as CoFe and FeB for free layer 221a. Further, the fabrication and integration process of making the device of FIG. 2 is simplified because making taller magnets is easier than making shorter magnets, for example.

In some embodiments, SHE interconnect 222 (or the write electrode) includes 3D materials such as one or more of (β-Tantalum (β-Ta), Ta, (β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SHE interconnect 222 transitions into high conductivity non-magnetic metal(s) 223a/b to reduce the resistance of SHE interconnect 222. The non-magnetic metal(s) 223a/b include one or more of: Cu, Co, α-Ta, Al, CuSi, or NiSi.

In some embodiments, SHE interconnect 222 comprises a spin orbit 2D material which includes one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, SHE interconnect 222 comprises spin orbit material which includes one of a 2D material or a 3D material, wherein the 3D material is thinner than the 2D material. In some embodiments, the SHE interconnect 222 comprises a spin orbit material which includes materials that exhibit Rashba-Bychkov effect.

In some embodiments, the 2D materials include one or more of: Mo, S, W, Se, Graphene, $MoS_2$, $WSe_2$, $WS_2$, or $MoSe_2$. In some embodiments, the 2D materials include an absorbent which includes one or more of: Cu, Ag, Pt, Bi, Fr, or H absorbents. In some embodiments, the SOC structures comprise a spin orbit material which includes materials that exhibit Rashba-Bychkov effect. In some embodiments, material which includes materials that exhibit Rashba-Bychkov effect comprises materials $ROCh_2$, where 'R' includes one or more of: La, Ce, Pr, Nd, Sr, Sc, Ga, Al, or In, and where "Ch" is a chalcogenide which includes one or more of: S, Se, or Te.

Here, the free magnet layer 221a (also referred to as the switching layer 221a) has its easy axis along the out-of-plane (z) direction. For this type, an external field along the y-axis, $H_y$, is applied to break the symmetry and achieve bipolar switching. Assuming that the driving force for switching originates from the spin Hall effect in interconnect 222, the critical current density $J_C$ is given by:

$$J_c = \frac{2e}{h} \frac{M_s t_F}{\theta_{SH}^{eff}} \left( \frac{H_K^{eff}}{2} - \frac{H_y}{\sqrt{2}} \right)$$

where e is the elementary charge, h is the Dirac contact, $\theta_{SH}^{eff}$ is the effective spin Hall angle, and $M_s$, $t_F$, and $H_K^{eff}$ are the saturation magnetization, thickness and effective anisotropy field of the ferromagnet layer 221a, respectively, e is the elementary charge, $M_s$ is the saturation magnetization, $t_F$ (same as H) is the thickness of the ferromagnet layer 221a along the z-direction, $H_{K,in}^{eff}$ is in-plane effective anisotropy field, and $H_{K,out}^{eff}$ is the out-of-plane effective anisotropy field of the ferromagnet layer 221a.

In this example, the applied current $I_w$ is converted into spin current $I_s$ by SHE interconnect 222 (also referred to as the spin orbit coupling interconnect). This spin current switches the direction of magnetization of the free layer and thus changes the resistance of MTJ 221. However, to read out the state of MTJ 221, a sensing mechanism is needed to sense the resistance change.

The magnetic cell is written by applying a charge current via SHE interconnect 222. The direction of the magnetic writing in free magnet layer 221a is decided by the direction of the applied charge current. Positive currents (e.g., currents flowing in the +y direction) produce a spin injection current with transport direction (along the +z direction) and spins pointing to the +x direction. The injected spin current in turn produces spin torque to align the free magnet 221a (coupled to SHE layer 222 of SHE material) in the +x direction. Negative currents (e.g., currents flowing in the -y direction) produce a spin injection current with transport direction (along the +z direction) and spins pointing to the -x direction. The injected spin current in-turn produces spin torque to align the free magnet 221a (coupled to the SHE material of layer 222) in the -x direction. In some embodiments, in materials with the opposite sign of the SHE/SOC effect, the directions of spin polarization and thus of the free layer magnetization alignment are reversed compared to the above. In some embodiments, the magnets 221a and/or 221c are paramagnets. In some embodiments, the magnets 221a and/or 221c can be a combination of ferromagnets or paramagnets. For example, magnet 221a is a ferromagnet while magnet 221c is a paramagnet. In another example, magnet 221c is a ferromagnet while magnet 221a is a paramagnet.

Figure 3:
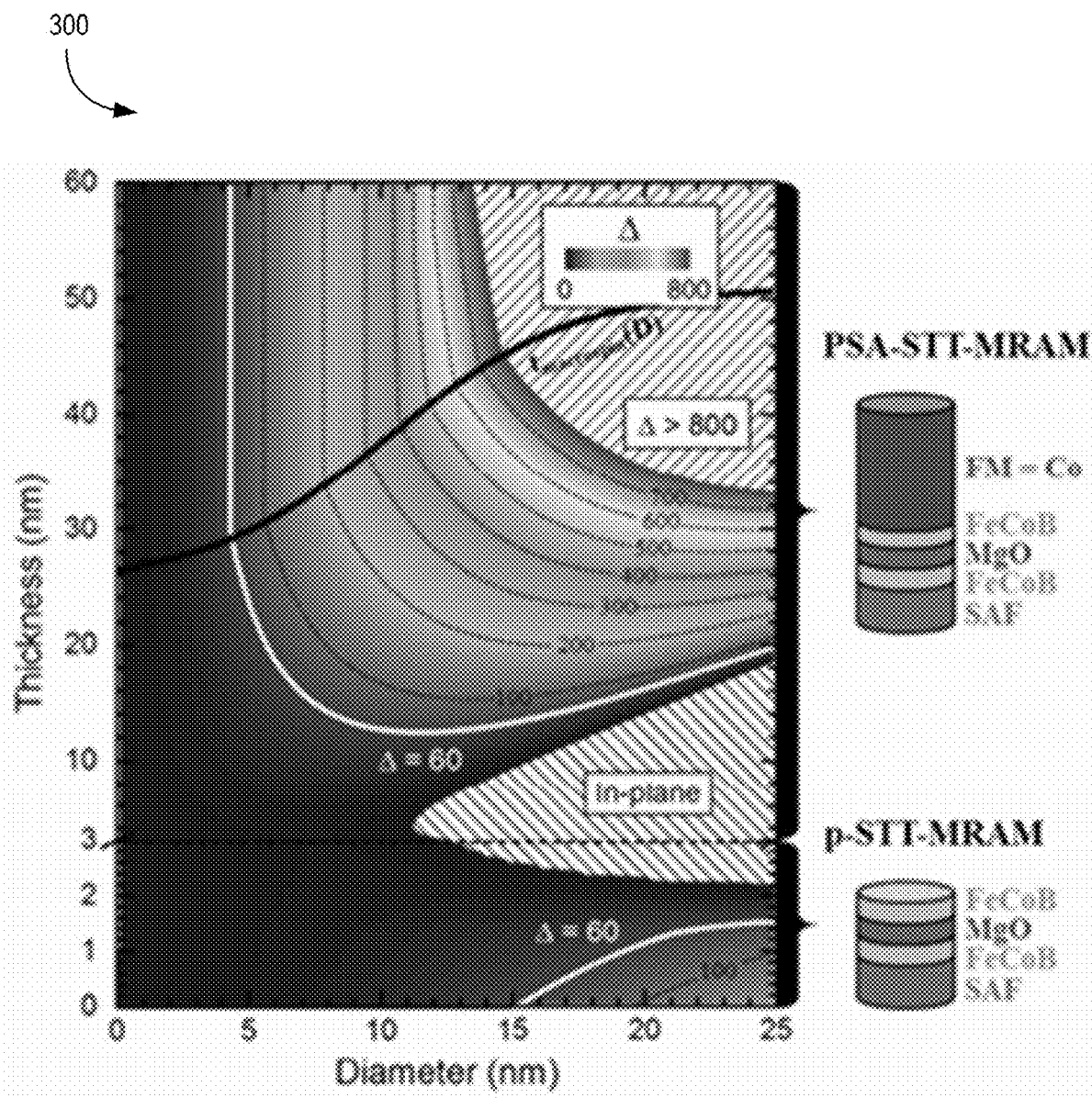
FIG. 3 illustrates a plot showing free magnet layer stability values as a function of thickness and diameter.

FIG. 3 illustrates a plot 300 showing free magnet layer stability values as a function of thickness and diameter. As the diameter is scaled to smaller dimensions, stability in the free magnet can be achieved by relying on the large thicknesses of the magnetic layers. This gives rise to the nano-rod structure. For example, at a diameter of 10 nm with thickness of 18 nm, a stability of 100 kT is achieved in the free magnet.

Figure 4A:
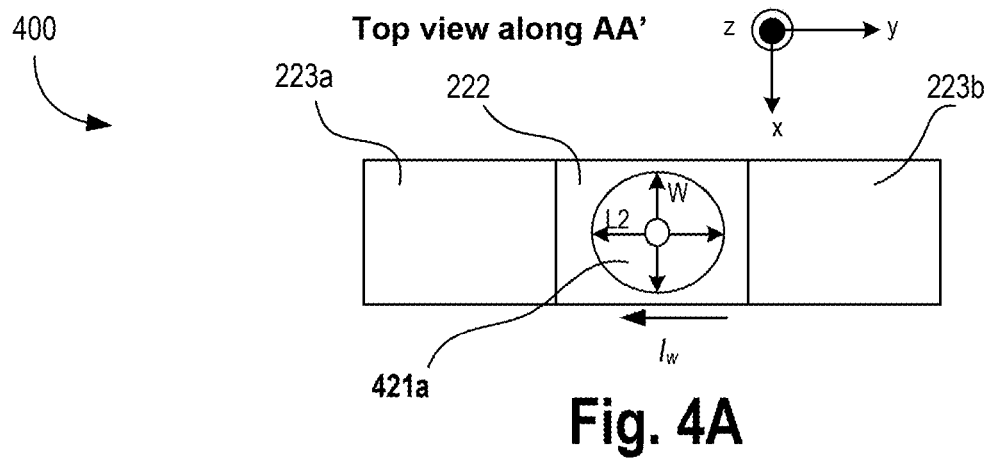
FIG. 4A illustrates a top view of the device of FIG. 2, in accordance with some embodiments.
Figure 4B:
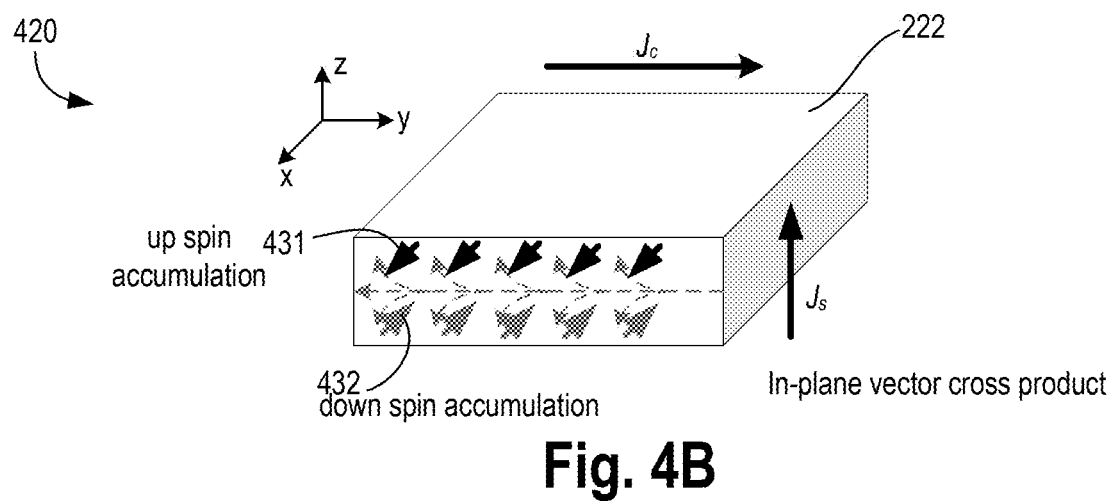
FIG. 4B illustrates a cross-section of the SOC interconnect with electrons having their spins polarized in-plane and deflected up and down resulting from a flow of charge current.

FIG. 4A illustrates a top view 400 of the device of FIG. 2, in accordance with some embodiments. FIG. 4B illustrates a cross-section 420 of the SOC interconnect 222 with electrons having their spins polarized in-plane and deflected up and down resulting from a flow of charge current. In this example, positive charge current represented by $J_c$ produces spin-front (e.g., in the +x direction) polarized current 431 and spin-back (e.g., in the -x direction) polarized current 432. The injected spin current $\vec{I_s}$ generated by a charge current $\vec{I_c}$ in the write electrode 222 is given by:

$$\vec{I_s} = P_{SHE}(w, t, \lambda_{sf}, \theta_{SHE})(\vec{I_c} \times \hat{z}) \quad (1)$$

where, the vector of spin current $\vec{I_s} = \vec{I_\uparrow} - \vec{I_\downarrow}$ points in the direction of transferred magnetic moment and has the magnitude of the difference of currents with spin along and opposite to the spin polarization direction, $\hat{z}$ the unit vector perpendicular to the interface, $P_{SHE}$ is the spin Hall injection efficiency which is the ratio of magnitude of transverse spin current to lateral charge current, w is the width of the magnet, t is the thickness of the SHE interconnect (or write electrode) 222, $\lambda_{sf}$ is the spin flip length in SHE interconnect 222, $\theta_{SHE}$ is the spin Hall angle for SHE interconnect 222 to free ferromagnetic layer interface. The injected spin angular momentum per unit time responsible for the spin torque is given by:

$$\vec{S} = h\vec{I_s}/2e \quad (2)$$

The generated spin up and down currents 231/232 are equivalent to the spin polarized current per unit area (e.g., $\vec{J_s}$) given by:

$$\vec{J_s} = \theta_{SHE}(\vec{J_c} \times \hat{z}) \quad (3)$$

This spin to charge conversion is based on Tunnel Magneto Resistance (TMR) which is highly limited in the signal strength generated. The TMR based spin to charge conversion has low efficiency (e.g., less than one).

Figure 5A:
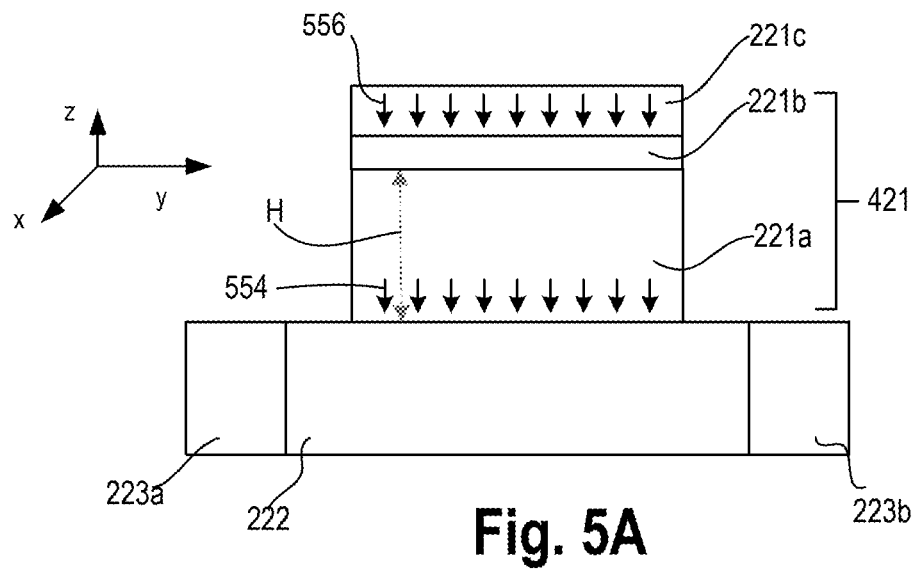
FIGS. 5A-C illustrate a mechanism for switching the out-of-plane MTJ memory device comprising a nano-rod (e.g. device of FIG. 2) formed on a spin orbit torque electrode, in accordance with some embodiments.
Figure 5B:
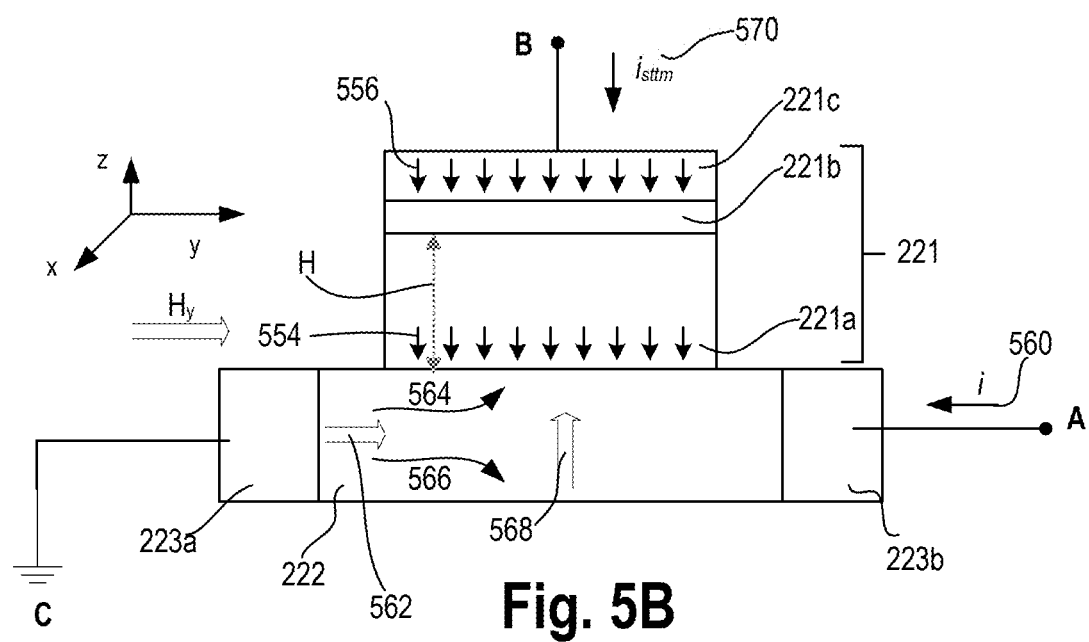
Figure 5C:
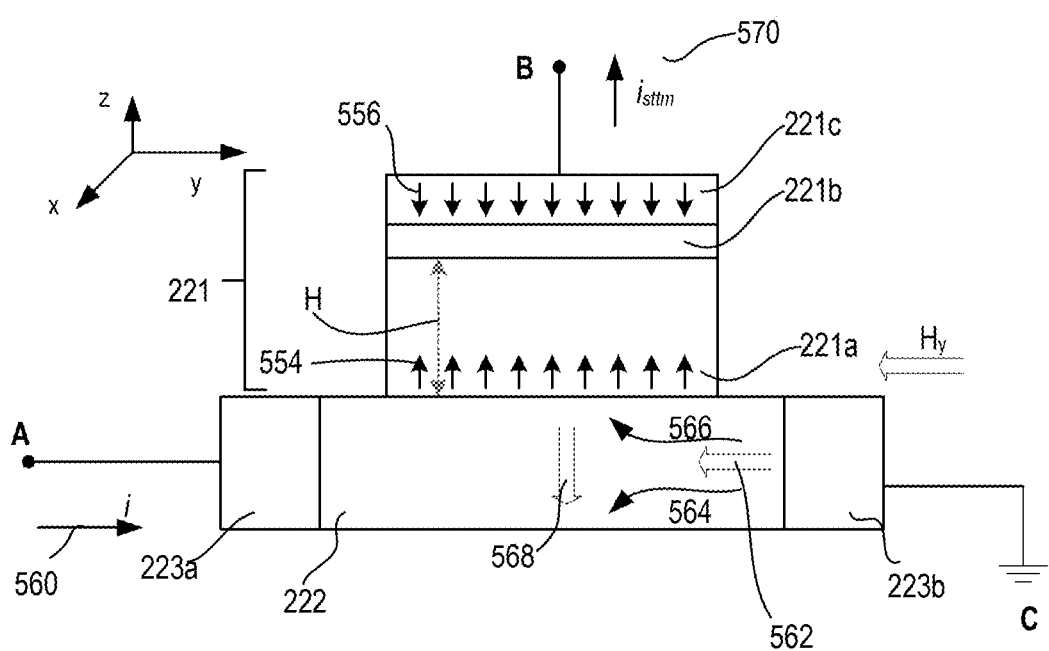

FIGS. 5A-C illustrate a mechanism for switching the out-of-plane MTJ memory device comprising a nano-rod (e.g. device of FIG. 2) formed on a spin orbit torque electrode, in accordance with some embodiments.

FIG. 5A illustrates an MTJ memory device (e.g., device 400) where MTJ 221 is disposed on a spin orbit torque electrode 222, and where a magnetization 554 of the free magnet 221a (also referred to as storage layer 221a) is in the same direction as a magnetization 556 of the fixed magnet 221c. In some embodiments, the direction of magnetization 554 of the storage layer 221a and the direction of magnetization 556 of the fixed magnet 221c are both in the negative z-direction as illustrated in FIG. 5A. When the magnetization 554 of the storage layer 221a is in the same direction as a magnetization 556 of the fixed magnet 221c, MTJ memory device 400 is in a low resistance state.

Conversely, when the magnetization 554 of the storage layer 221a is in the opposite direction as a magnetization 556 of the fixed magnet 221c, MTJ memory device 400 is in a high resistance state.

FIG. 5B illustrates a SOT memory device (e.g., device 400) switched to a high resistance state. In an embodiment, a reversal in the direction of magnetization 554 of the storage layer 221a in FIG. 5B compared to the direction of magnetization 554 of the storage layer 221a is brought about by (a) inducing a spin hall current 568 in the spin orbit torque electrode 222 in the y-direction and (b) by applying a spin torque transfer current 570, $i_{STTM}$, (by applying a positive voltage at terminal B with respect to ground C), and/or (c) by applying an external magnetic field, $H_y$, in the y-direction.

In an embodiment, a charge current 560 is passed through the spin orbit torque electrode 222 in the negative y-direction (by applying a positive voltage at terminal A with respect to ground C). In response to the charge current 560, an electron current 562 flows in the positive y-direction. The electron current 562 includes electrons with two opposite spin orientations and experience a spin dependent scattering phenomenon in the spin orbit torque electrode 222.

The electron current 562 includes electrons with two opposing spin orientations, a type I electron 566, having a spin oriented in the negative x-direction and a type II electron 564 having a spin oriented in the positive x-direction. In some embodiments, electrons constituting the electron current 562 experience a spin dependent scattering phenomenon in the spin orbit torque electrode 222. The spin dependent scattering phenomenon is brought about by a spin-orbit interaction between the nucleus of the atoms in the spin orbit torque electrode 222 and the electrons in the electron current 562. The spin dependent scattering phenomenon causes type I electrons 566, whose spins are oriented in the negative x-direction, to be deflected upwards towards an uppermost portion of the spin orbit torque electrode 222 and type II electrons 564 whose spins are oriented in the positive x-direction to be deflected downwards towards a lowermost portion of the spin orbit torque electrode 222.

The separation between the type I electron spin angular moment 566 and the type II electron spin angular moment 564 induces a polarized spin diffusion current 568 in the spin orbit torque electrode 222. In some embodiments, the polarized spin diffusion current 568 is directed upwards toward the free magnet 221a of the MTJ memory device 400 as depicted in FIG. 5B. The polarized spin diffusion current 568 induces a spin hall torque on the magnetization 554 of the free magnet 221a. The spin hall torque rotates the magnetization 554 to a temporary state pointing in the negative x-direction. In some embodiments, to complete the magnetization reversal process an additional torque is applied. The $i_{STTM}$ current 570 flowing through the MTJ memory device 400 exerts an additional torque on the magnetization 554 of the storage layer 221a. The combination of spin hall torque and spin transfer torque causes flipping of magnetization 554 in the storage layer 221a from the intermediate magnetization state (negative x-direction) to a positive z-direction illustrated in FIG. 5B. In some embodiments, an additional torque can be exerted on the storage layer 221a by applying an external magnetic field, $H_y$, in the y-direction, as illustrated in FIG. 5B, instead of applying an $i_{STTM}$ current 570.

FIG. 5C illustrates an SOT memory device switched to a low resistance state. In an embodiment, a reversal in the direction of magnetization 554 of the storage layer 221a in FIG. 5C compared to the direction of magnetization 554 of the storage layer 221a in FIG. 5B is brought about by (a) reversing the direction of the spin hall current 568 in the spin orbit torque electrode 222 and (b) by reversing the direction of the $i_{STTM}$ current 570, and/or (c) by reversing the direction of the external magnetic field, $H_y$.

Figure 6B:
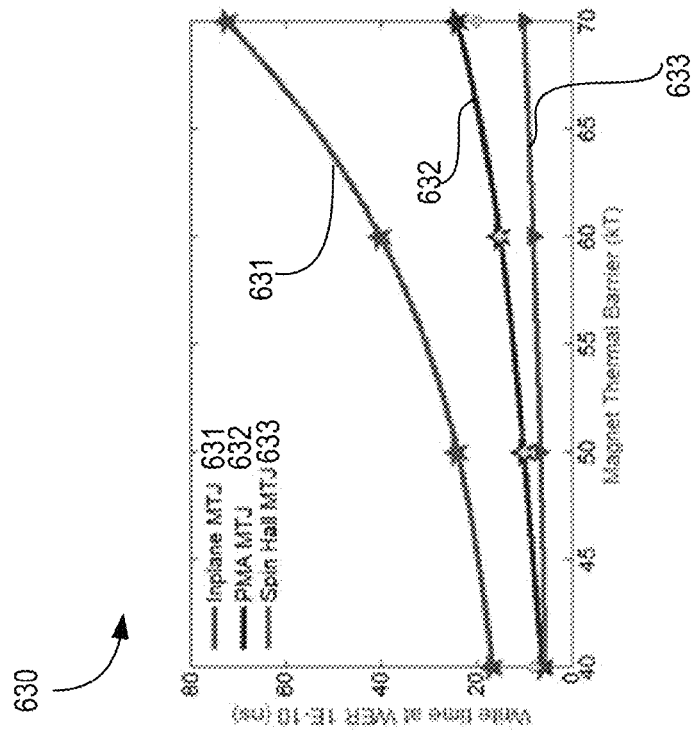
FIG. 6B illustrates a plot comparing reliable write times for spin Hall MRAM and spin torque MRAM.
Figure 6A:
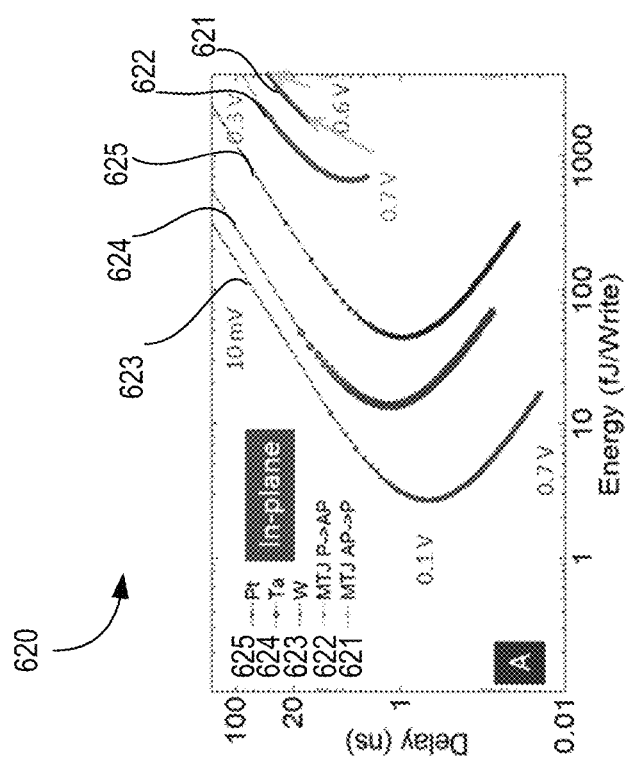
FIG. 6A illustrates a plot showing write energy-delay conditions for one transistor and one MTJ with spin Hall effect (SHE) material (e.g., device of FIG. 2) compared to traditional MTJs.

FIG. 6A illustrates plot 620 showing write energy-delay conditions for one transistor and one MTJ with SHE material (e.g., device of FIG. 2) compared to traditional MTJs. FIG. 6B illustrates plot 630 showing write energy-delay conditions for one transistor and one MTJ with SHE material (e.g., device 200) compared to traditional MTJs. Here, the x-axis is energy per write operation in femto-Joules (fJ) while the y-axis is delay in nano-seconds (ns).

Here, the energy-delay trajectory of SHE and MTJ devices (e.g., device 200) are compared for in-plane magnet switching as the applied write voltage is varied. The energy-delay relationship (for in-plane switching) can be written as:

$$E(\tau) = R_{write} I_{co}^2 \frac{\left(\tau + \tau_0 \ln\left(\frac{\pi}{2\theta_0}\right)\right)^2}{\tau}$$
$$= \frac{4}{h^2} \frac{R_{write}}{P^2} \frac{1}{\tau}\left(\mu_0 e \alpha \frac{M_s}{2}\left(\tau + \tau_0 \ln\left(\frac{\pi}{2\theta}\right)\right)^2\right) W$$

where $R_{write}$ is the write resistance of the device (resistance of SHE electrode or resistance of MTJ-P or MTJ-AP, where MTJ-P is an MTJ with parallel magnetizations while MTJ-AP is an MTJ with anti-parallel magnetizations, $\mu_0$ is vacuum permeability, e is the electron charge. The equation shows that the energy at a given delay is directly proportional to the square of the Gilbert damping $\alpha$. Here the characteristic time, $\tau_0 = M_s V e / I_c P_{\mu_B}$ varies as the spin polarization varies for various SHE metal electrodes (e.g., 623, 624, 625). Plot 620 shows five curves 621, 622, 623, 624, and 625. Curves 621 and 622 show write energy-delay conditions using traditional MTJ devices without SHE material.

For example, curve 621 shows the write energy-delay condition caused by switching a magnet from anti-parallel (AP) to parallel (P) state, while curve 622 shows the write energy-delay condition caused by switching a magnet from P to AP state. Curves 622, 623, and 624 show write energy-delay conditions of an MTJ with SHE material. Clearly, write energy-delay conditions of an MTJ with SHE material (e.g., device 200) is much lower than the write energy-delay conditions of an MTJ without SHE material (device not shown). While the write energy-delay of an MTJ with SHE material (e.g., device 200) improves over a traditional MTJ without SHE material, further improvement in write energy-delay is desired.

FIG. 6B illustrates plot 630 comparing reliable write times for spin Hall MRAM and spin torque MRAM. There are three cases considered in plot 630. Waveform 631 is the write time for in-plane MTJ, waveform 632 is the write time for PMA MTJ, and waveform 633 is the write time for spin Hall MTJ. The cases considered here assume a 30×60 nm magnet with 40 kT energy barrier and 3.5 nm SHE electrode thicknesses. The energy-delay trajectories of the devices are obtained assuming a voltage sweep from 0 V to 0.7 V in accordance to voltage restrictions of scaled CMOS. The energy-delay trajectory of the SHE-MTJ devices exhibits broadly two operating regions A) Region 1 where the energy-delay product is approximately constant ($\tau_d < M_s V e / I_c P_{\mu_B}$), and Region 2 where the energy is proportional to the delay $\tau_d > M_s V e / I_c P_{\mu_B}$. The two regions are separated by energy minima at $\tau_{opt}=M_sVe/I_cP_{\mu_B}$ where minimum switching energy is obtained for the spin torque devices.

The energy-delay trajectory of the STT-MTJ (spin transfer torque MTJ) devices is limited with a minimum delay of 1 ns for in-plane devices at 0.7 V maximum applied voltage, the switching energy for P-AP and AP-P are in the range of 1 pJ/write. In contrast, the energy-delay trajectory of SHE-MTJ (in-plane anisotropy) devices can enable switching times as low as 20 ps (β-W with 0.7 V, 20 fJ/bit) or switching energy as small as 2 fJ (β-W with 0.1 V, 1.5 ns switching time).

Figures 7A, 7B:
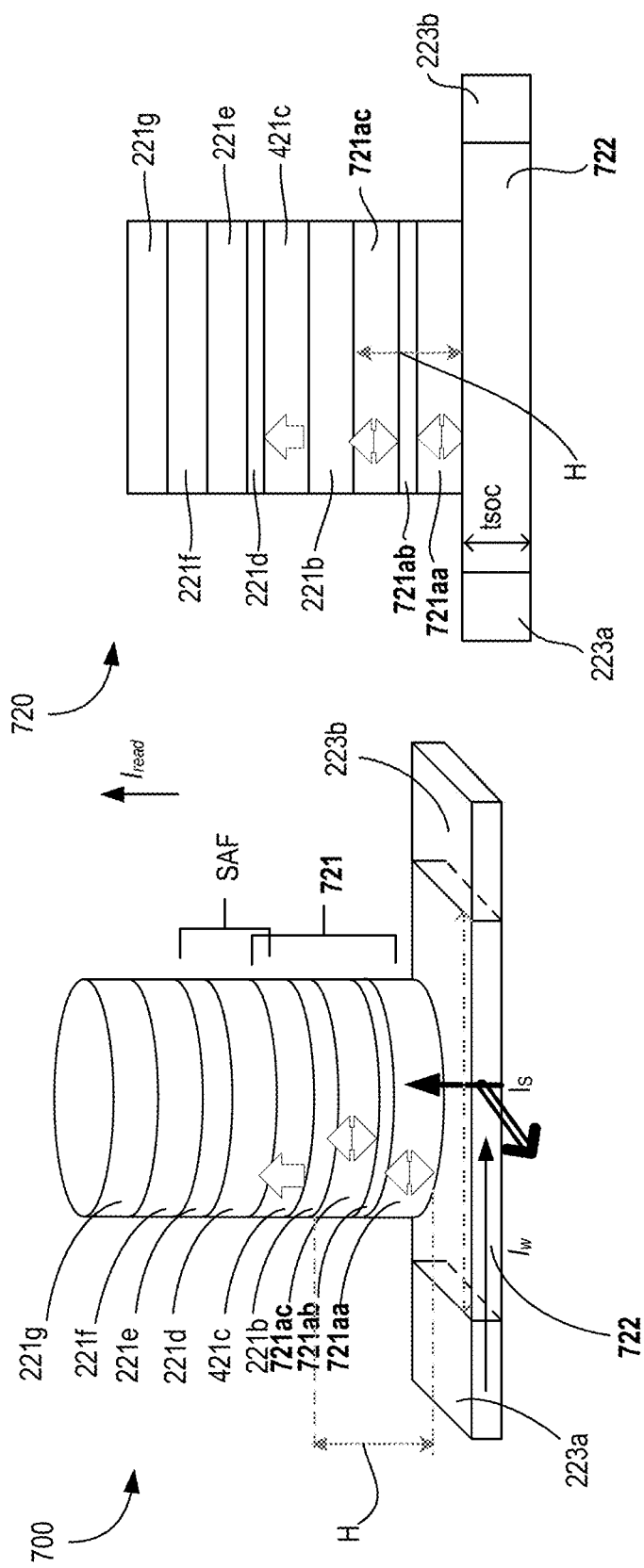
FIGS. 7A-B illustrate a 3D view and corresponding cross-section view, respectively, of a device having a magnetic junction with magnets having perpendicular magnetizations, where the free magnet (a nano-rod) has a thickness substantially greater than a width of the free magnet, according to some embodiments of the disclosure.

FIGS. 7A-B illustrate a 3D view 700 and corresponding cross-section view 720, respectively, of a device having a magnetic junction with magnets having perpendicular magnetizations, where the free magnet (e.g., a nano-rod) has a thickness substantially greater than a width of the free magnet, according to some embodiments of the disclosure.

The device of FIG. 7A is similar to the device of FIG. 2. Here, the free magnet 221*a* of FIG. 2 is replaced with a structure comprising a stack of layers or films. The magnetic junction is illustrated by reference sign 721 where the layers under layer 221*b* (e.g., dielectric or metal/metal-oxide) together form the free magnet structure comprising the free magnet of the junction.

In some embodiments, the structure replacing free magnet 221*a* comprises at least two free magnets 721*aa* and 721*ac* with a coupling layer 721*ab* between them. In some embodiments, the insert layer 725 couples to (or is adjacent to) the SOC electrode 222. In some embodiments, SOC/AFM interconnect 222 of FIG. 2 comprises doped AFM and is labeled as SOC/AFM interconnect 722. In some embodiments, the AFM of SOT interconnect 722 is doped by one of: oxygen, nitrogen or heavy metal with large spin flip length and small thermal mobility such as Ta, Pt, W, Mo, Co, Ni and others. In some embodiments, the AFM of interconnect 722 applies SOT and in-plane exchange bias to the free layer 721*aa*/221*a*. In some embodiments, the thickness $t_{SOC}$ of interconnect 722 is in the range of 0.5 nm to 20 nanometers.

In some embodiments, the AFM of interconnect 722 is doped with one of: Co, Fe, Ni, MnGa, MnGeGa, or Bct-Ru. In some embodiments, the doping material can be: IrMn, PtMn, NiMn or other triangular, Kagomi, chiral or hexagonal antiferromagnetic material and in their single crystal form or their amorphous alloys in various compositions. In some embodiments, the doping can be done by co-sputtering and/or reactive ion sputtering in case of oxygen or nitrogen. In some embodiments, the oxygen and/or fluorine doping can be done by plasma treatments.

One advantage of doping or co-sputtering the low temperature high-efficiency SOT/AFM material of electrode 722 with heavy metals, oxygen, nitrogen, or other AFM with high blocking temperature is that it will allow for higher current and higher temperature operation without the loss of AFM nature. Doping or co-sputtering with heavier metals will increase the blocking temperature of the AFM in electrode 722. Typically, heavy metals are less responsive to diffusion. In some embodiments, doping the SOT/AFM electrode 722 with nitrogen and oxygen has the potential to increase not just the blocking temperature, but the spin orbit torque generated by the AFM layer as well. This makes the PSOT based MRAM more reliable.

In some embodiments, the other free magnet 721*ac* of the free magnet structure couples to or is adjacent to a dielectric (e.g., when the magnetic junction is an MTJ) or a metal or its oxide (e.g., when the magnetic junction is a spin valve). In some embodiments, the free magnet structure comprises a first free magnet 721*aa* having perpendicular magnetization that can point substantially along the +z-axis or −z-axis according to an external field (e.g., spin torque, spin coupling, electric field); a coupling layer 721*ab*; and a second free magnet 721*ac* having perpendicular magnetization that can point substantially along the +z-axis or −z-axis. In various embodiments, the second free magnet 721*ac* is adjacent to layer 221*b* (e.g., dielectric or metal/metal-oxide).

In some embodiments, the coupling layer 721*ab* includes one or more of: Ru, Os, Hs, Fe, or other transition metals from the platinum group of the periodic table. In some embodiments, magnets 721*aa*, 721*ac*, and 724 comprise CFGG. In some embodiments, magnets 721*aa*, 721*ac*, and 724 are formed from Heusler alloys. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSn$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, magnets 721*aa* and 721*ac* with PMA comprises a stack of materials, wherein the materials for the stack are selected from a group comprising: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; or materials with tetragonal crystal structure. In some embodiments, the magnet with PMA is formed of a single layer of one or more materials. In some embodiments, the single layer comprises Mn and Ga (e.g., MnGa).

FIGS. 7C-D illustrate a 3D view 730 and corresponding cross-section view 740, respectively, of a device having a magnetic junction with magnets having perpendicular magnetizations, where the free magnet has a thickness substantially greater than a width of the free magnet, according to some embodiments of the disclosure.

The device of FIGS. 7C-D is similar to device of FIGS. 7A-B but for the composition of interconnect 722. Here, interconnect 722 is replaced with a composite interconnect 733, in accordance with some embodiments. In some embodiments, the thickness to is 0.1 nm to 20 nm. In some embodiments, composite interconnect 733 comprises two or more layers of 733*a* and 722*b*. In some embodiments, the two or more layers of 733*a* and 733*b* includes AFM material. In various embodiments, layer 733*a* comprises an AFM material that has the highest spin orbit torque compared to other non 733*a* layers. In some embodiments, the AFM material of interconnect 733 applies interfacial in-plane exchange bias to free layer 721*aa*. In some embodiments, AFM material includes one of: Ir, Pt, Mn, Pd, or Fe. In some embodiments, the AFM material is a quasi-two-dimensional triangular AFM including $Ni_{(1-x)}M_xGa_2S_4$, where 'M' includes one of: Mn, Fe, Co or Zn. In some embodiments, the thickness of ta and tb are in the range of 0.1 nm to 8 nm.

In some embodiments, AFM layers 733*a/b* are doped by one of: oxygen, nitrogen or heavy metal with large spin flip length and small thermal mobility such as Ta, Pt, W, Mo, Co, Ni and others. In some embodiments, AFM layers 733*a/b* are doped with one of: Co, Fe, Ni, MnGa, MnGeGa, or Bct-Ru. In some embodiments, doping the layers of SOT/AFM electrode 733 with nitrogen and oxygen has the potential to increase not just the blocking temperature, but the spin orbit torque generated by the AFM layer 733*a* coupled to fee layer 721*aa*. This makes the PSOT based MRAM of FIGS. 7C-D more reliable.

Figure 7E:
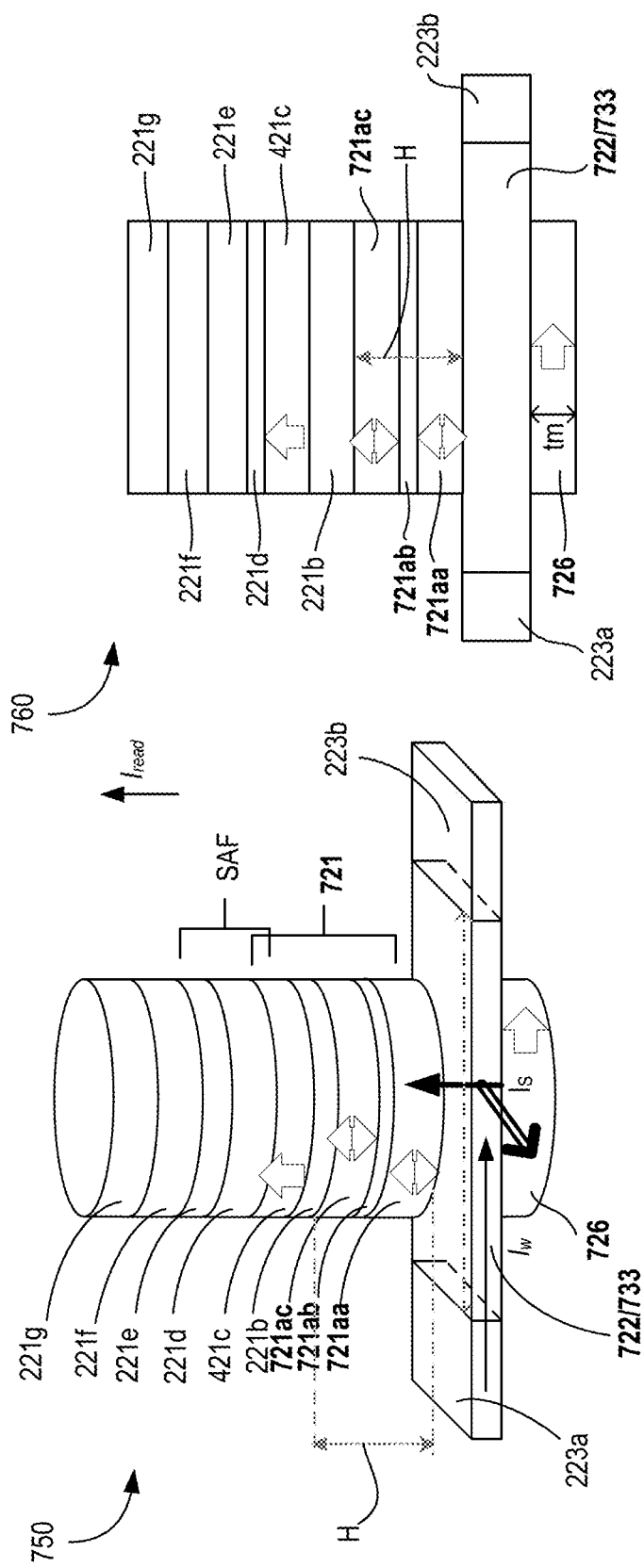
FIGS. 7E-F illustrate a 3D view and corresponding cross-section view, respectively, of a device having a magnetic junction with magnets having perpendicular magnetizations, where the free magnet has a thickness substantially greater than a width of the free magnet, according to some embodiments of the disclosure.
Figure 7F:

FIGS. 7E-F illustrate a 3D view 750 and corresponding cross-section view 760, respectively, of a device having a magnetic junction with magnets having perpendicular magnetizations, where the free magnet has a thickness substantially greater than a width of the free magnet, according to some embodiments of the disclosure.

In some embodiments, the device of FIGS. 7E-F includes an in-plane fixed magnet 726 adjacent to one of the surfaces of the interconnect 722/733, such free magnet 721aa is adjacent to the other surface opposite to the surface of interconnect 722/733. In some embodiments, the in-plane fixed magnet 726 is thick or long enough in dimensions that results in a stable in-plane magnet that applies an effective in-plane field on the perpendicular free magnets 721aa and/or 721ac for faster switching of free magnets 721aa and/or 721ac. In some embodiments, the in-plane fixed magnet thickness tm is in the range of 1 nm to 20 nm. The effective in-plane field can be applied via exchange bias interaction or dipole coupling from the in-plane fixed magnet 726. For example, in-plane magnet 726 has a magnetization pointing along the x-direction or y-direction and is parallel to the x-y plane of the device 750. Here, the switching speed of the free magnets in the structure is improved over the same power consumption over the switching speed of the free magnet 221a of FIG. 2, at the same time the blocking temperature is increased by interconnect 722/733.

FIGS. 7G-H illustrate a 3D view 770 and corresponding cross-section view 780, respectively, of a device having a magnetic junction with magnets having perpendicular magnetizations, where the free magnet has a thickness substantially greater than a width of the free magnet, and a via comprising an in-plane magnet and an AFM, one of which is adjacent to the SOT/AFM interconnect, according to some embodiments of the disclosure.

The device of FIG. 7G is similar to the device of FIG. 7E, but for addition of AFM 727 in the magnetic via. In some embodiments, the in-plane fixed magnet 726 of the magnetic via is coupled to or is adjacent to an in-plane AFM or synthetic AFM (SAF) 727 also formed in the magnetic via. The order of the AFM 727 and in-plane fixed magnet 726 can be switched. For example, in some embodiments, AFM 727 is adjacent to interconnect 222/722 while the in-plane fixed magnet 726 is below AFM 727 and not in direct contact with interconnect 722/733.

In some embodiments, AFM or SAF 727 comprises a material which includes one of: Ir, Pt, Mn, Pd, or Fe. In some embodiments, AFM or SAF 727 is a quasi-two-dimensional triangular AFM including $Ni_{(1-x)}M_xGa_2S_4$, where 'M' includes one of: Mn, Fe, Co or Zn. In some embodiments, AFM or SAF 727 comprises a pair of fixed magnets 727a and 727c with in-plane magnetizations, and a coupling layer 727b between the fixed magnets 727a and 727c. In some embodiments, the materials for the fixed magnets 727a/c can be according to any of the materials for magnets discussed herein. In various embodiments, fixed magnets 727a/c are in-plane magnets. In some embodiments, the material for coupling layer 727b can be the same material (or selected from the same group of materials) as that of coupling layer 721ab. Technical effect wise, the device of FIG. 7G performs similarly to the device of FIG. 7A, and improves switching speed of free magnets 721aa and 721ac relative to switching speed of free magnet 221a, and also results in higher blocking temperature.

FIGS. 7I-J illustrate a 3D view 790 and corresponding cross-section view 795, respectively, of a device having a magnetic junction with magnets having perpendicular magnetizations, where the free magnet has a thickness substantially greater than a width of the free magnet, and a via comprising an in-plane magnet which is adjacent to the AFM, according to some embodiments of the disclosure.

The device of FIG. 7I is similar to the device of FIG. 7G except that the AFM 727 is also incorporated outside the magnetic via as AFM 728 adjacent to SOC/AFM interconnect 722. In some embodiments, AFM 728 can behave as an etch stop layer when fabricating SOC/AFM interconnect 722. As such, one or more additional processes for forming an etch stop layer is/are removed. In various embodiments, AFM 728 assists with keeping the magnetization of magnet 726 stable with in-plane magnetization. In some embodiments, AFM 728 also comprises a pair of fixed magnets (not shown) with in-plane magnetizations, and a coupling layer between the fixed magnets like AFM 727. Technical effect wise, the device of FIG. 7I performs similarly to the devices of FIG. 7G, and improves switching speed of free magnets 721aa and 721ac relative to the switching speed of free magnet 221a by SHE electrode 222 alone, and also increases the blocking temperature.

In some embodiments, layer 728 comprises an oxide AFM such as BFO which is adjacent to SOT/AFM electrode 733 or SOT/AFM electrode 222 (without the doping for increasing blocking temperature). In some embodiments, magnetic via is not part of device 790. In other embodiments, magnetic via comprising AFM 727 and/or in-plane magnet 726 is adjacent to the oxide AFM layer 728. In some embodiments, oxide AFM of layer 728 increases the blocking temperature of the un-doped SOT/AFM electrode 222.

Figure 8A:
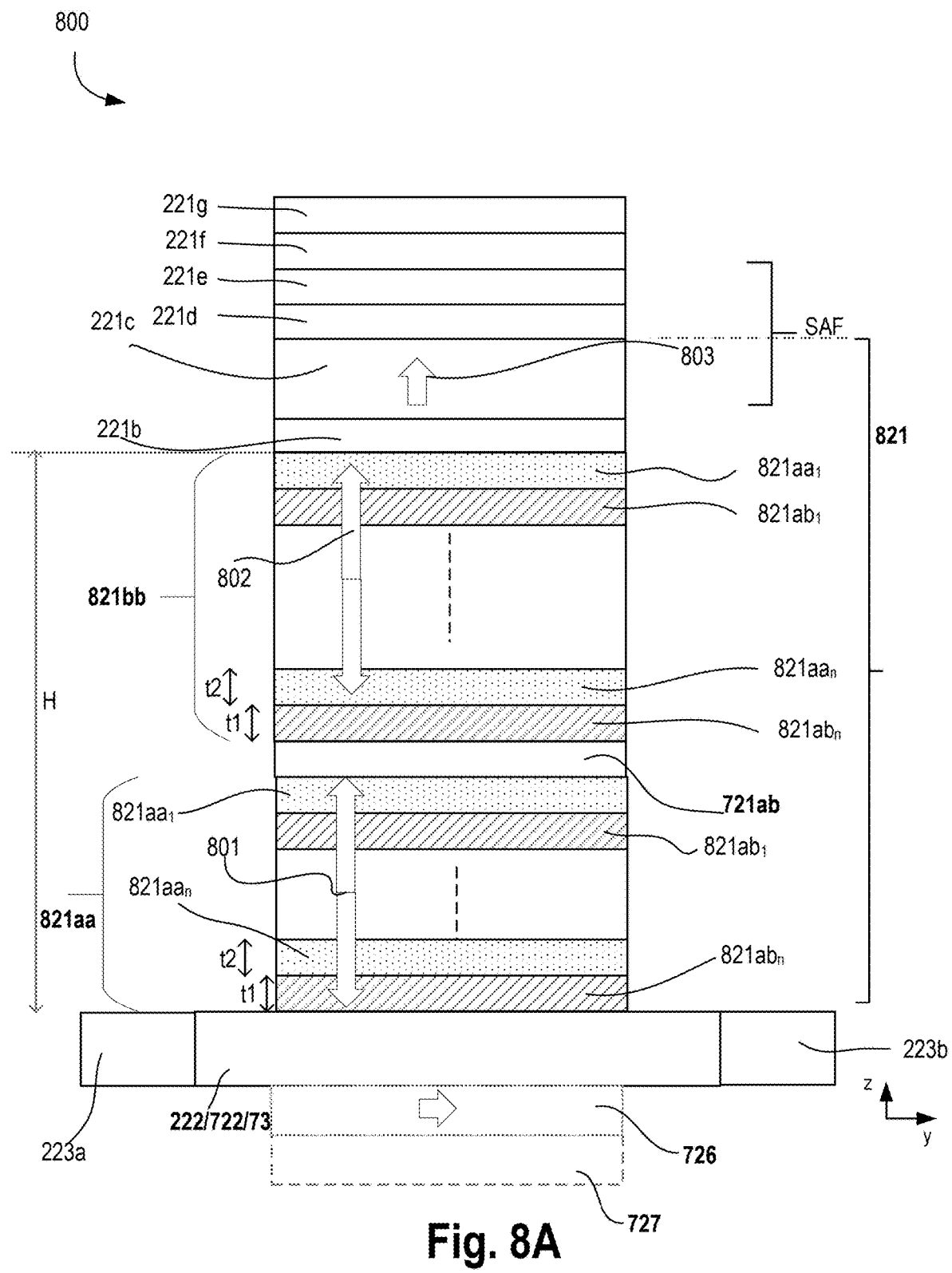
FIG. 8A illustrates a cross-section of a device having a magnetic junction with magnets having perpendicular magnetizations, where a free magnet structure of the magnetic junction comprises a stack of magnets with perpendicular magnetizations, where the free magnet has a thickness substantially greater than a width of the free magnet, and a via comprising an in-plane magnet and/or an AFM, one of which is adjacent to the SOT/AFM interconnect, according to some embodiments of the disclosure.

FIG. 8A illustrates a cross-section of device 800 having a magnetic junction with magnets having perpendicular magnetizations, where a free magnet structure of the magnetic junction comprises a stack of magnets with perpendicular magnetizations, where the free magnet has a thickness substantially greater than a width of the free magnet, and a via comprising an in-plane magnet and/or an AFM one of which is adjacent to the SOT/AFM interconnect, according to some embodiments of the disclosure.

The magnetic junction here is illustrated by reference sign 821 where the layers under layer 221b (e.g., dielectric or metal/metal-oxide) together form the structure comprising the free magnet of the junction. The device of FIG. 8A is similar to the device of FIG. 7A except that the free magnets 721aa and 721ac are replaced with composite magnets having multiple layers.

In some embodiments, the composite stack of multi-layer free magnet 821aa includes 'n' layers of first material and second material. For example, the composite stack comprises layers 821$aa_{1-n}$ and 821$ab_{1-n}$ stacked in an alternating manner, where 'n' has a range of 1 to 10. In some embodiments, the first material includes one of: Co, Ni, Fe, or an Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t1 in a range of 0.6 nm to 2 nm. In some embodiments, the second material has a thickness t2 in a range of 0.1 nm to 3 nm. While the embodiments here show first material being at the bottom followed by the second material, the order can be reversed without changing the technical effect. In various embodiments, free magnet structure 821aa is coupled to interconnect 722/733, which increases the blocking temperature.

In some embodiments, composite stack of multi-layer free magnet 821bb includes 'n' layers of first material and second material. For example, the composite stack comprises layers 821aa$_{1-n}$ and 821ab$_{1-n}$ stacked in an alternating manner, where 'n' has a range of 1 to 10. In some embodiments, the first material includes one of: Co, Ni, Fe, or a Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t1 in a range of 0.6 nm to 2 nm. In some embodiments, the second material has a thickness t2 in a range of 0.1 nm to 3 nm. While the embodiments here show first material being at the bottom followed by the second material, the order can be reversed without changing the technical effect.

The embodiments of FIGS. 7A-J can be mixed in any order. For example, the in-plane magnet 726 can be replaced with an AFM magnet, free magnet structure with free magnets and coupling layer can be replaced with a single magnet with free magnetization, etc. In some embodiments, the magnets (free and/or fixed) can also be paramagnets.

Figure 8B:
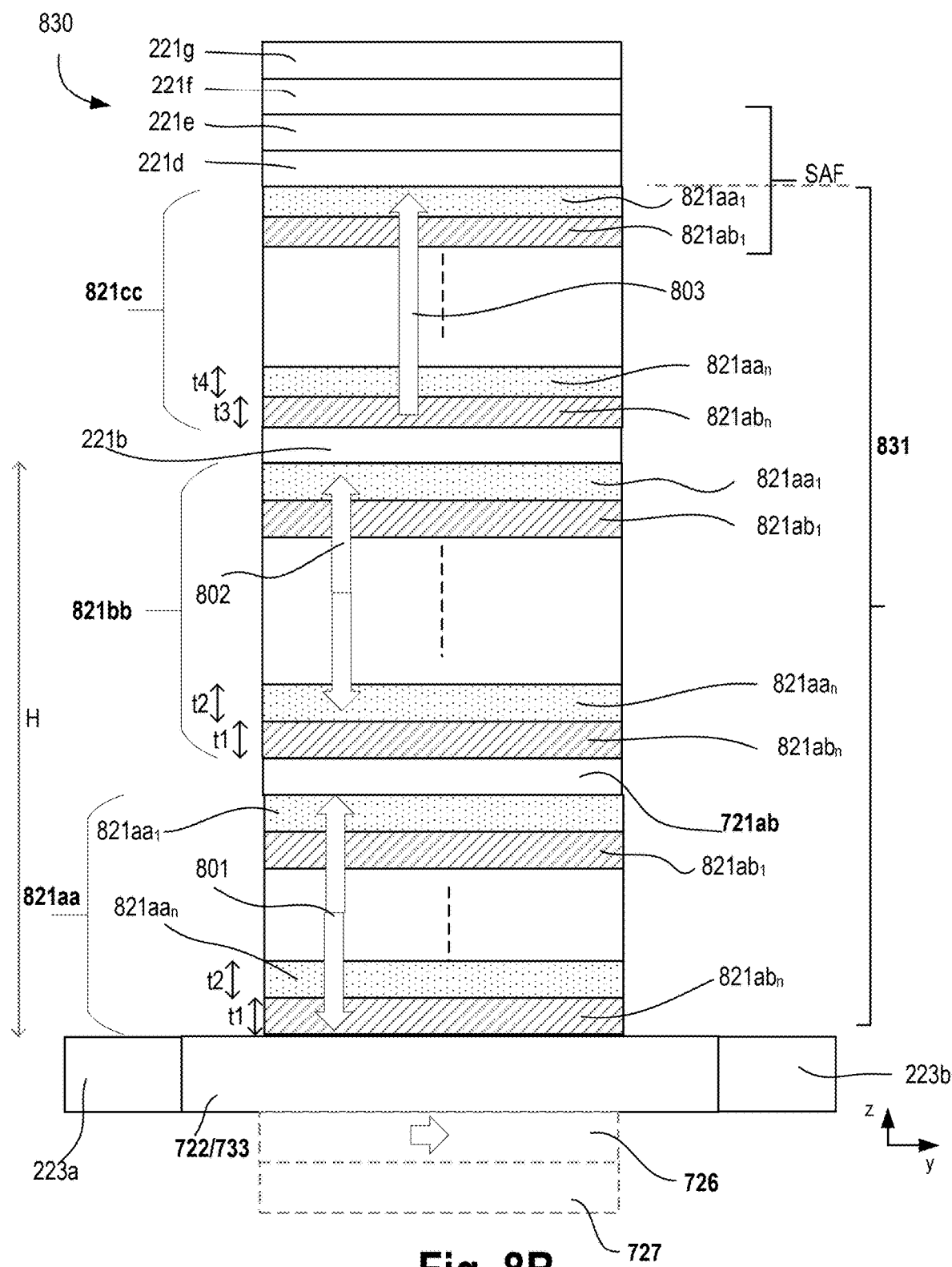
FIG. 8B illustrates a cross-section of a device having a magnetic junction with magnets having perpendicular magnetizations, where a free magnet structure and a fixed magnet structure of the magnetic junction comprises a stack of magnets with perpendicular magnetizations, where the free magnet has a thickness substantially greater than a width of the free magnet, and a via comprising an in-plane magnet and/or an AFM, one of which is adjacent to the SOT/AFM interconnect, according to some embodiments of the disclosure.

FIG. 8B illustrates a cross-section of device 830 having a magnetic junction with magnets having perpendicular magnetizations, where a free magnet structure and a fixed magnet structure of the magnetic junction comprises a stack of magnets with perpendicular magnetizations, where the free magnet has a thickness substantially greater than a width of the free magnet, and a via comprising an in-plane magnet and/or an AFM, one of which is adjacent to the SOT/AFM interconnect, according to some embodiments of the disclosure.

Here, fixed magnet 221c of FIG. 8A is replaced with a composite stack. As such, the magnetic junction is labeled as 821cc. In some embodiments, composite stack of multi-layer fixed magnet 821cc includes 'n' layers of first material and second material. For example, the composite stack comprises layers 821aa$_{1-n}$ and 821ab$_{1-n}$ stacked in an alternating manner, where 'n' has a range of 1 to 10. In some embodiments, the first material includes one of: Co, Ni, Fe, or Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t3 in a range of 0.6 nm to 2 nm. In some embodiments, the second material has a thickness t4 in a range of 0.1 nm to 3 nm. While the embodiments here show the first material being at the bottom followed by the second material, the order can be reversed without changing the technical effect.

Figure 8C:
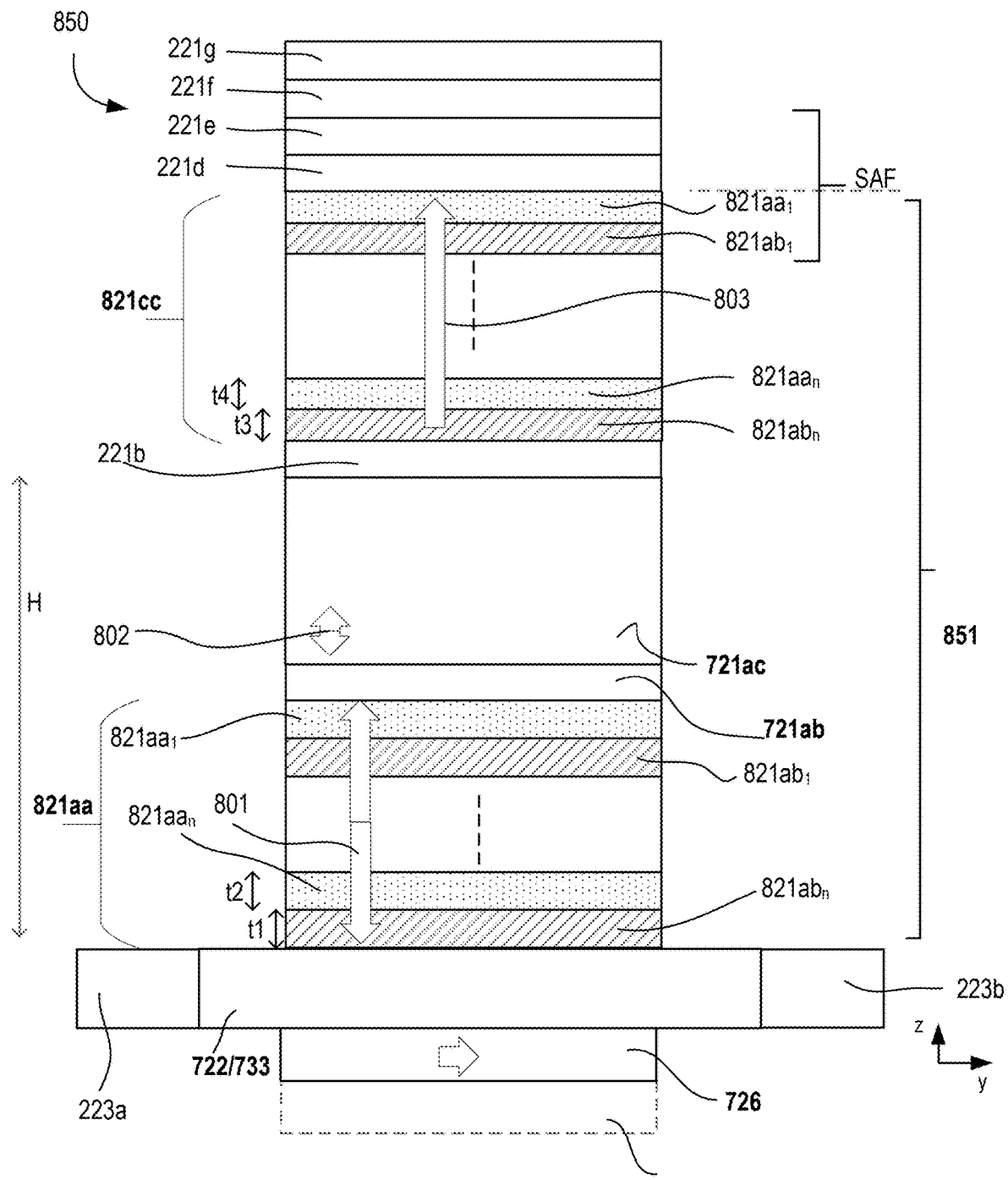
FIG. 8C illustrates a cross-section of a device having a magnetic junction with magnets having perpendicular magnetizations, where a fixed magnet structure and one of the free magnets of a free magnet structure of the magnetic junction comprises a stack of magnets with perpendicular magnetizations where the free magnet has a thickness substantially greater than a width of the free magnet, and a via comprising an in-plane magnet and/or an AFM, one of which is adjacent to the SOT/AFM interconnect, according to some embodiments of the disclosure.

FIG. 8C illustrates a cross-section of device 850 having a magnetic junction with magnets having perpendicular magnetizations, where a fixed magnet structure and one of the free magnets of a free magnet structure of the magnetic junction comprises a stack of magnets with perpendicular magnetizations where the free magnet has a thickness substantially greater than a width of the free magnet, and a via comprising an in-plane magnet and/or an AFM, one of which is adjacent to the SOT/AFM interconnect, according to some embodiments of the disclosure. Here, free magnet 821bb of FIG. 8C is replaced with a non-composite free magnet 721ac. As such, the magnetic junction is labeled as 851.

Figure 8D:
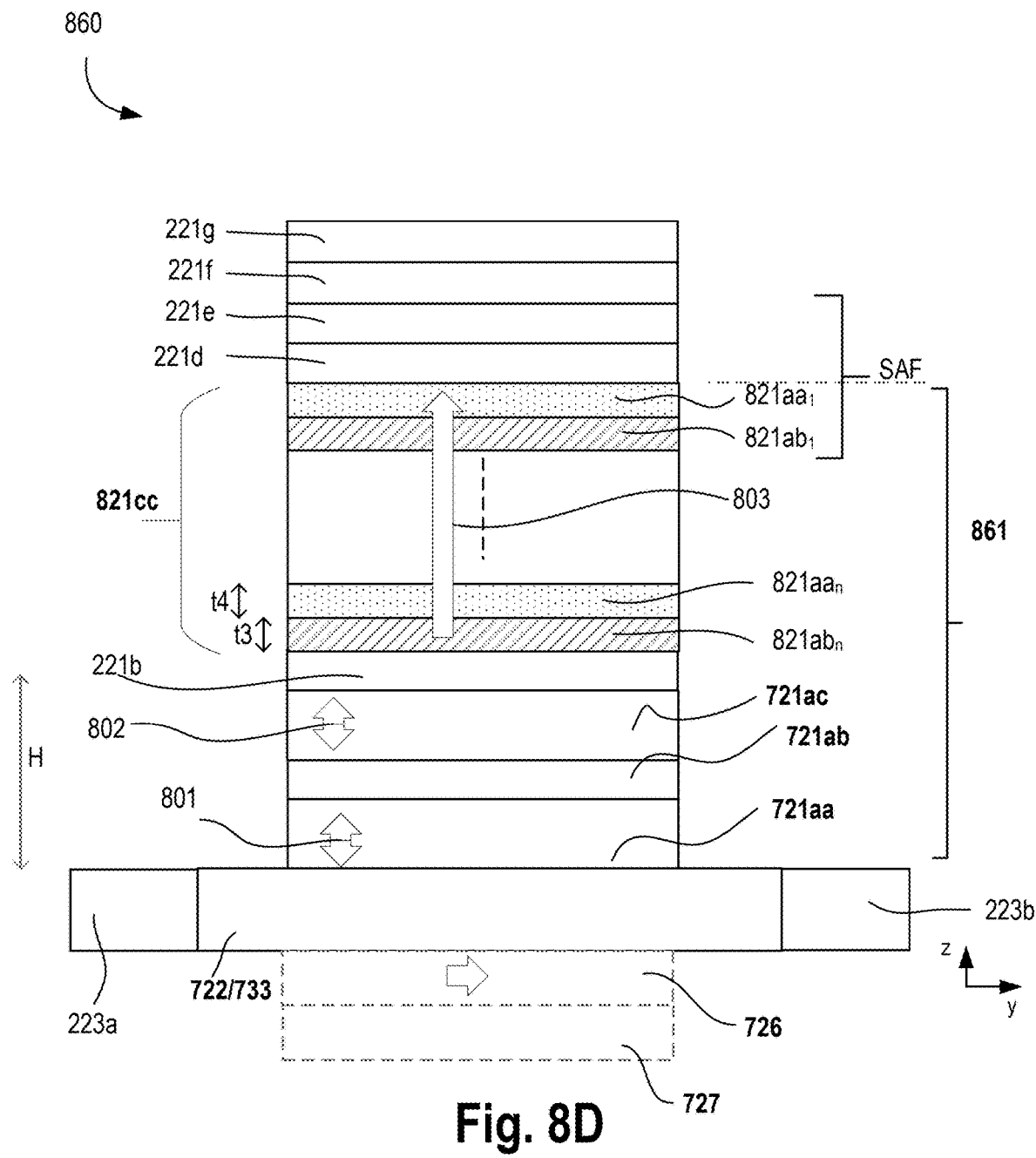
FIG. 8D illustrates a cross-section of a device having a magnetic junction with magnets having perpendicular magnetizations, where a fixed magnet structure of the magnetic junction comprises a stack of magnets with perpendicular magnetizations where the free magnet has a thickness substantially greater than a width of the free magnet, and a via comprising an in-plane magnet and/or an AFM, one of which is adjacent to the SOT/AFM interconnect, according to some embodiments of the disclosure.

FIG. 8D illustrates a cross-section of device 860 having a magnetic junction with magnets having perpendicular magnetizations, where a fixed magnet structure of the magnetic junction comprises a stack of magnets with perpendicular magnetizations where the free magnet has a thickness substantially greater than a width of the free magnet, and a via comprising an in-plane magnet and/or an AFM, one of which is adjacent to the SOT/AFM interconnect, according to some embodiments of the disclosure. Here, free magnet 821aa of FIG. 8D is replaced with a non-composite free magnet 721aa. As such, the magnetic junction is labeled as 861.

Figure 8E:
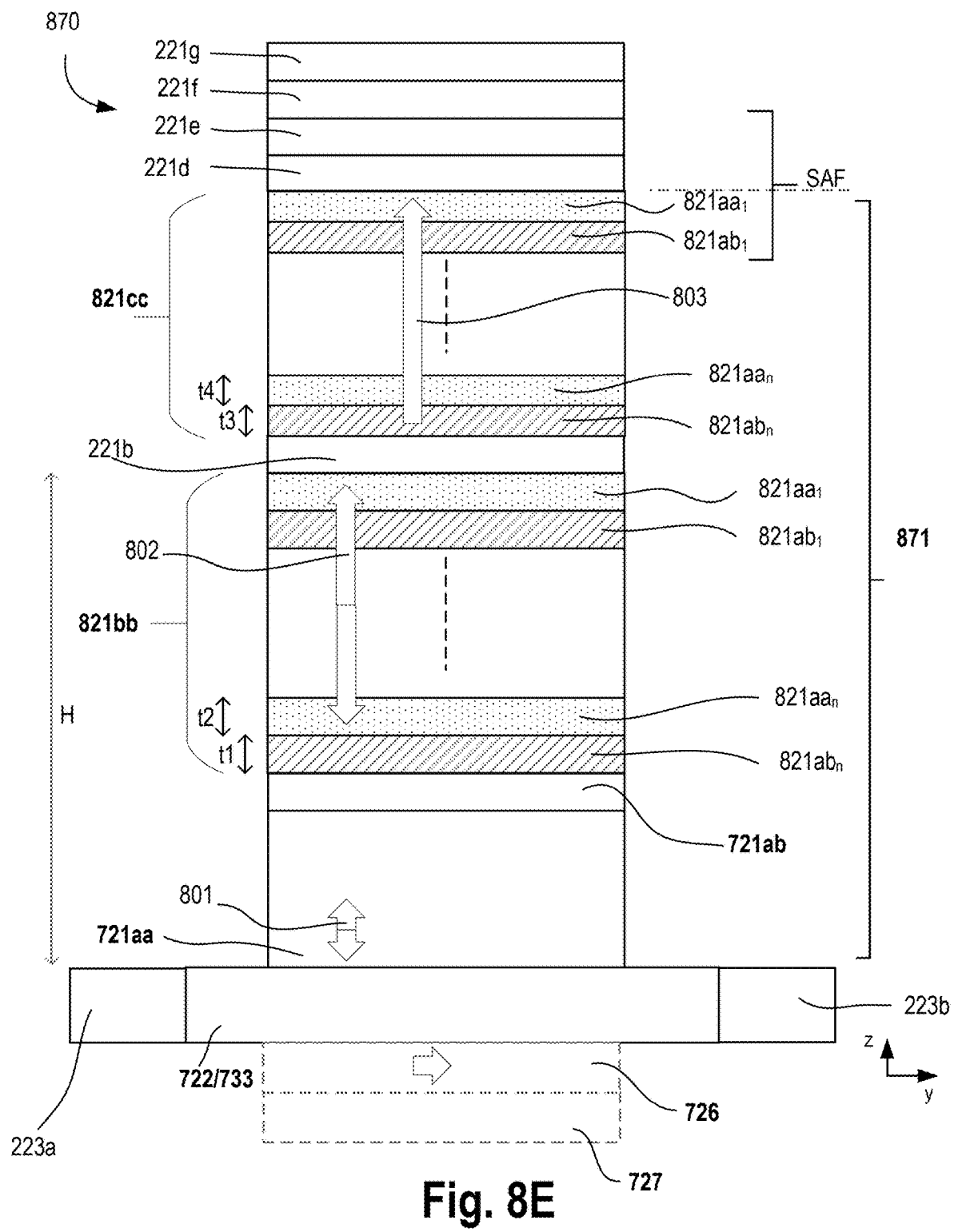
FIG. 8E illustrates a cross-section of a device having a magnetic junction with magnets having perpendicular magnetizations, where a fixed magnet structure and one of the free magnets of a free magnet structure of the magnetic junction comprises a stack of magnets with perpendicular magnetizations where the free magnet has a thickness substantially greater than a width of the free magnet, and a via comprising an in-plane magnet and/or an AFM, one of which is adjacent to the SOT/AFM interconnect, according to some embodiments of the disclosure.

FIG. 8E illustrates a cross-section of device 870 having a magnetic junction with magnets having perpendicular magnetizations, where a fixed magnet structure and one of the free magnets of a free magnet structure of the magnetic junction comprises a stack of magnets with perpendicular magnetizations where the free magnet has a thickness substantially greater than a width of the free magnet, and a via comprising an in-plane magnet and/or an AFM, one of which is adjacent to the SOT/AFM interconnect, according to some embodiments of the disclosure. Here, free magnet 821aa of FIG. 8B is replaced with a non-composite free magnet 721aa. As such, the magnetic junction is labeled as 871.

Figure 8F:
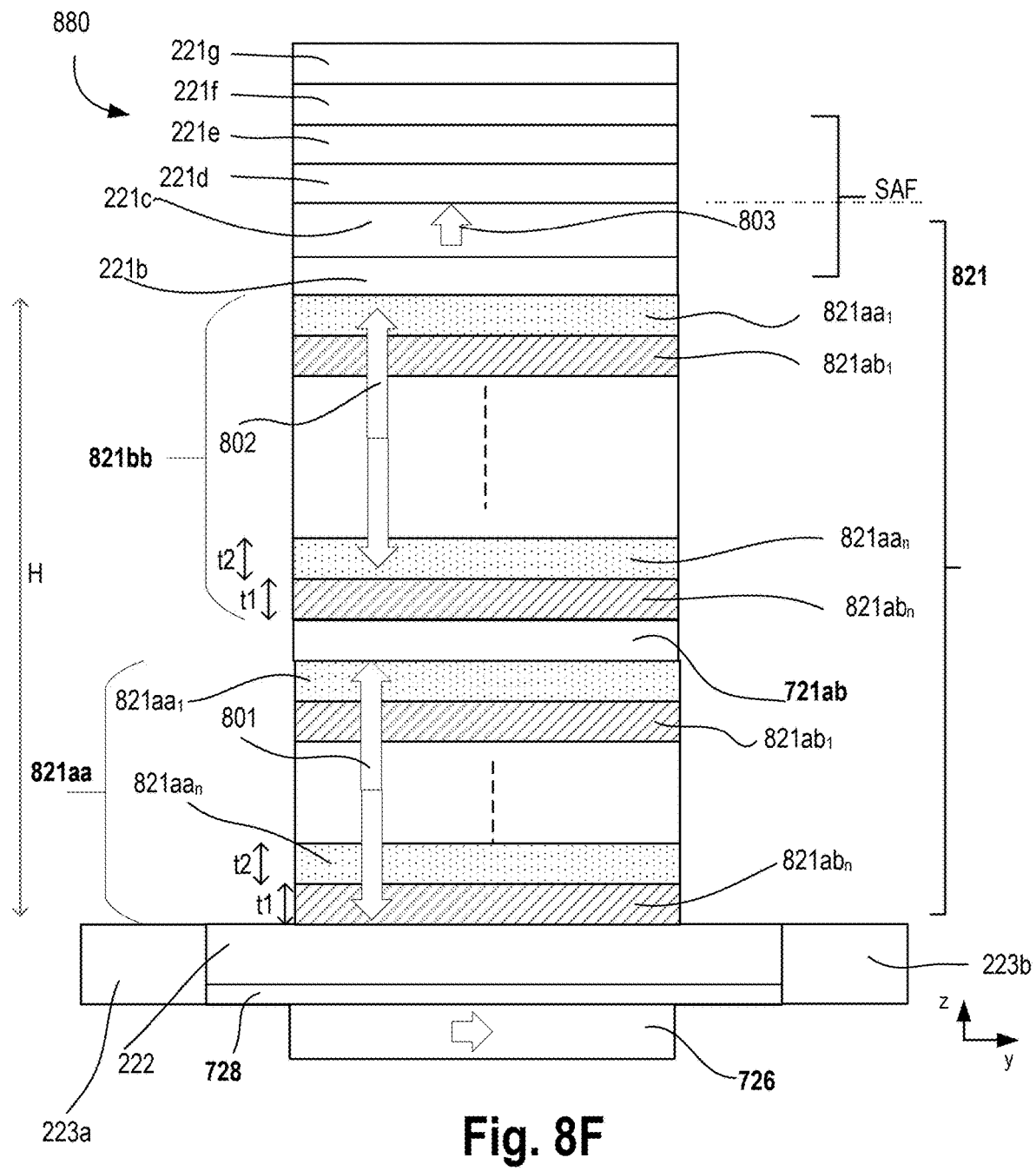
FIG. 8F illustrates a cross-section of a device having a magnetic junction with magnets having perpendicular magnetizations, where a free magnet structure and a fixed magnet structure of the magnetic junction comprises a stack of magnets with perpendicular magnetizations where the free magnet has a thickness substantially greater than a width of the free magnet, and a via comprising an in-plane magnet which is adjacent to an AFM embedded in the SOT/AFM interconnect, according to some embodiments of the disclosure.

FIG. 8F illustrates a cross-section of device 880 having a magnetic junction with magnets having perpendicular magnetizations, where a free magnet structure and a fixed magnet structure of the magnetic junction comprises a stack of magnets with perpendicular magnetizations where the free magnet has a thickness substantially greater than a width of the free magnet, and a via comprising an in-plane magnet which is adjacent to an AFM embedded in the SOT/AFM interconnect, according to some embodiments of the disclosure. Compared to FIG. 8F here, the AFM 727 is removed from the magnetic via and integrated in the SOC interconnect 222 as layer 728. In some embodiments, layer 728 is an AFM oxide layer which increases the blocking temperature of the interconnect, which now includes SOT/AFM 222 and layer 728. In some embodiments, the interconnect or electrode comprises SOC 222 and layer 728 (e.g., BFO).

FIG. 9A illustrates plot 900 showing spin polarization capturing switching of a free magnet structure which is exchanged coupled or biased by a magnetic via under an SOT/AFM interconnect, according to some embodiments of the disclosure. FIG. 9B illustrates magnetization plot 920 associated with FIG. 9A, according to some embodiments of the disclosure.

Plot 900 shows switching of the spin orbit torque device with PMA. Here, waveforms 901, 902, and 903 represent the magnetization projections on the x, y, and z axes, respectively. The magnet starts with z-magnetization of −1. Positive spin orbit torque (SOT) is applied from 5 ns (nanoseconds) to 50 ns. It leads to switching the z-magnetization to 1. Then, a negative spin orbit torque is applied between 120 ns and 160 ns. It leads to switching the z-magnetization to 1. This illustrates change of magnetization in response to write charge current of certain polarity.

FIG. 9C illustrates plot 830 showing spin polarization capturing switching of the free magnet structure which is exchanged coupled or biased by a magnetic via under an SOT/AFM interconnect, according to some embodiments of the disclosure. FIG. 9D illustrates magnetization plot 940 associated with FIG. 9C, according to some embodiments of the disclosure. Here, waveforms 931, 932, and 933 represent the magnetization projections on x, y, and z axes, respectively. The difference from the case of FIG. 9C is that negative spin orbit torque (SOT) is applied from 5 ns to 50 ns. As a result, the z-magnetization remains close to −1. This illustrates the persistence of magnetization in response to write charge current of opposite polarity.

Figure 10A:
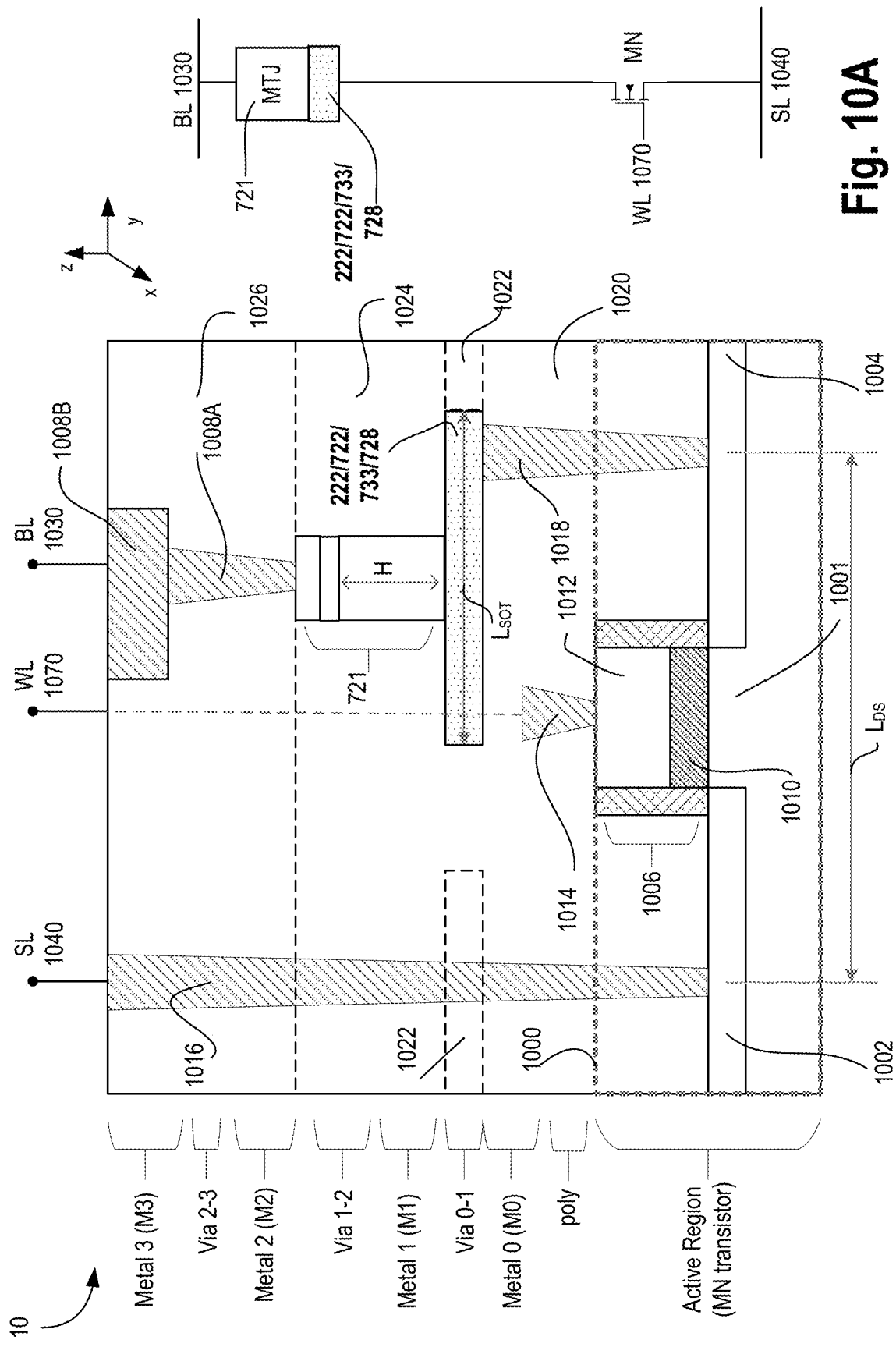
FIGS. 10A-C illustrate cross-sectional views of an SOT memory device (e.g., any one of devices of FIGS. 2, and 7-8) coupled to a first transistor and a bit line, according to some embodiments.
Figure 10B:
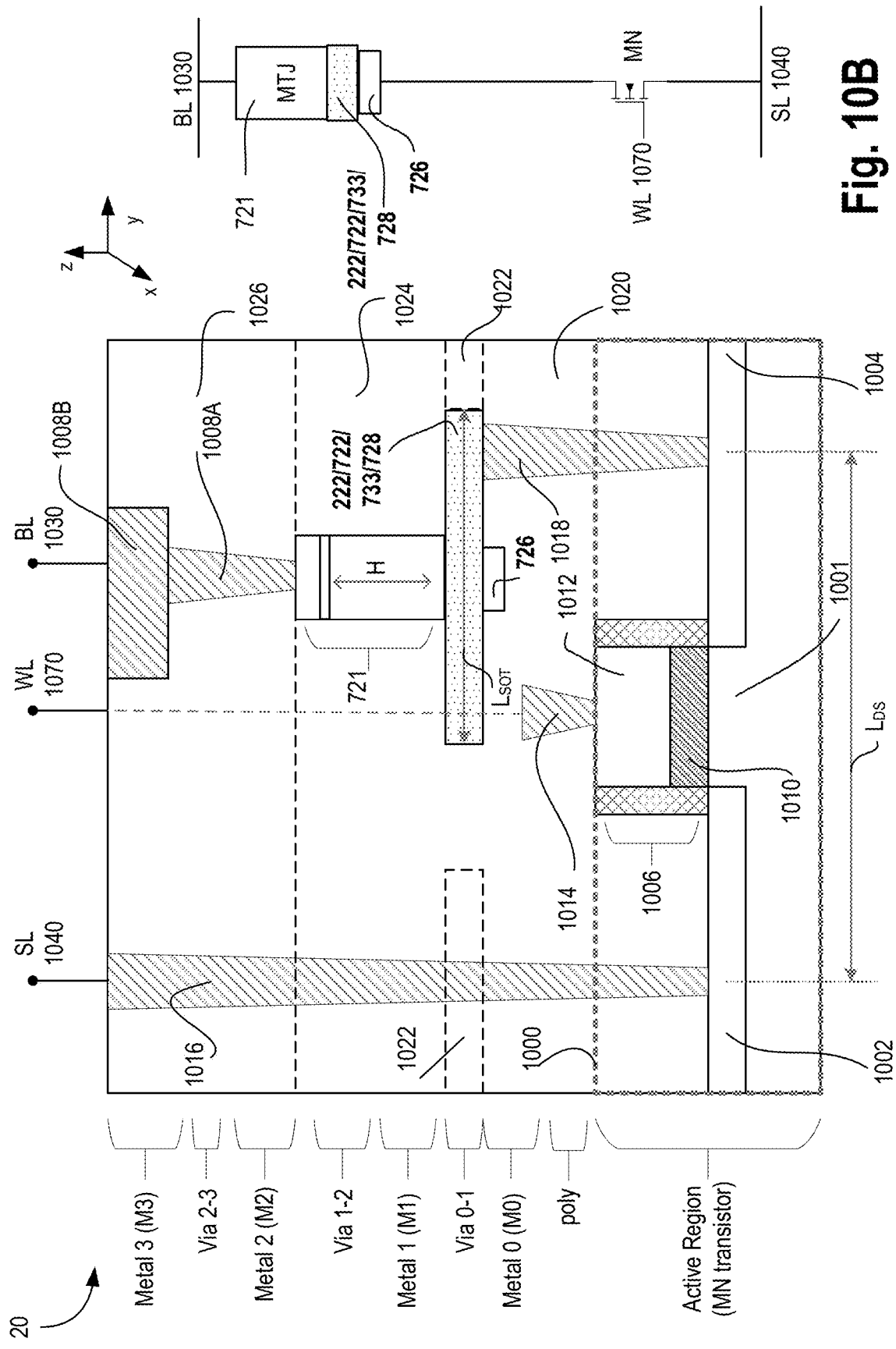
Figure 10C:
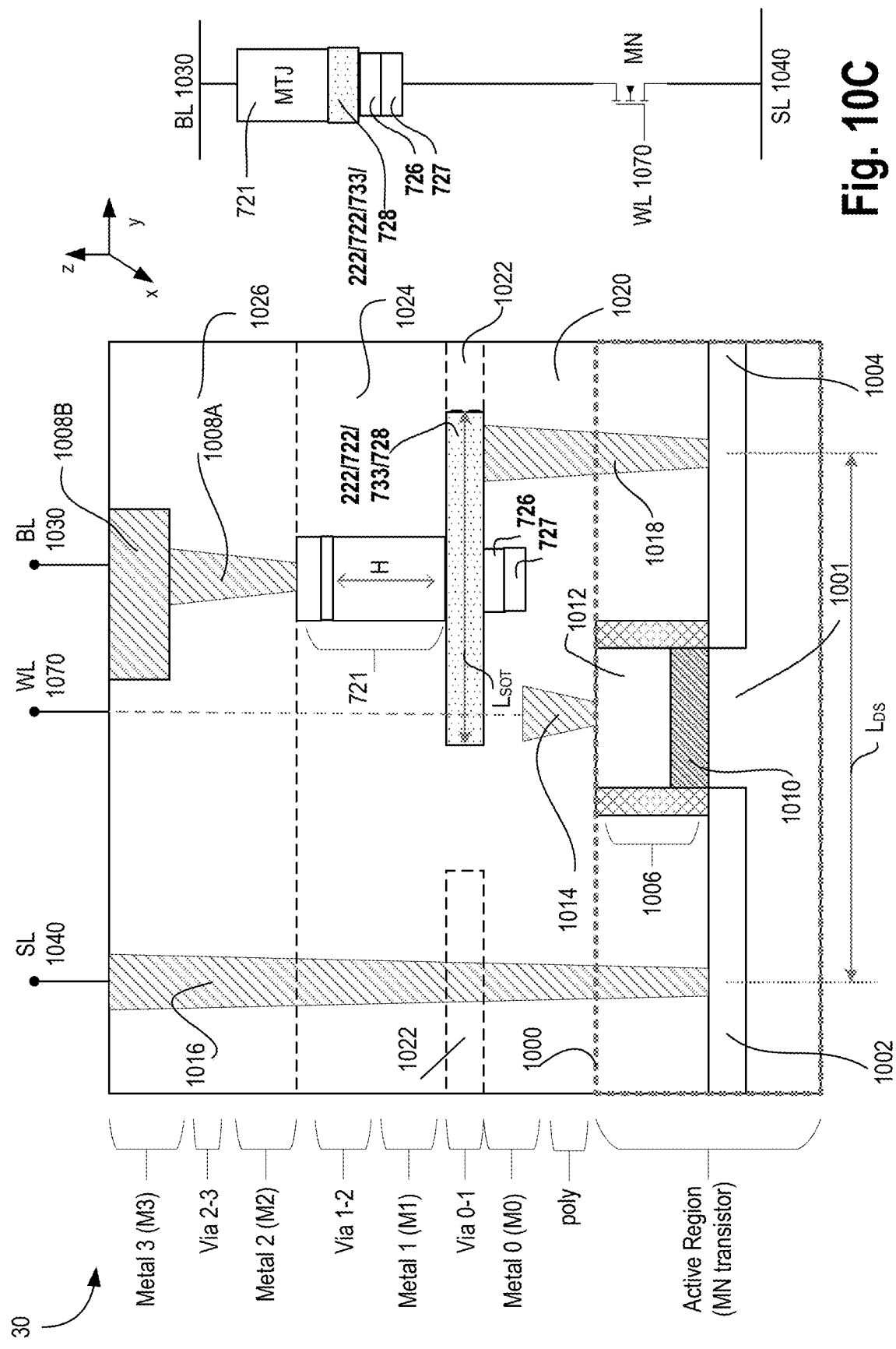

FIGS. 10A-C illustrate cross-sectional views, respectively, of an SOT memory device 10 1020, and 30, respectively (e.g., any one of devices of FIGS. 2, and 7-8) coupled to a first transistor and a bit line, according to some embodiments.

In an embodiment, the transistor is an n-type transistor MN that has a source region 1002, a drain region 1004 and a gate 1006. The transistor MN further includes a gate contact 1014 disposed above and electrically coupled to the gate 1006, a source contact 1016 disposed above and electrically coupled to the source region 1002, and a drain contact 1018 disposed above and electrically coupled to the drain region 1004. In some embodiments, an SOT memory device such as an SOT memory device of FIGS. 2, and 7-8 is disposed above the transistor. While the embodiments are illustrated with an n-type transistor MN, the transistor can be replaced with a p-type transistor.

In some embodiments, the SOT memory device includes a spin orbit torque electrode, such as spin orbit torque electrode 222/722/733 (or electrode comprising 222/728, where layer 728 is an AFM oxide, or electrode comprising 722 or 733 with layer 728), a magnetic tunnel junction memory device such as MTJ 221/721/821/831/841/851/861/871 is disposed on the spin orbit torque electrode 722/733, and a conductive interconnect structure such as conductive interconnect structure 708 (e.g., structure 708a/b) disposed on and coupled to the MTJ. In some embodiments, the spin orbit torque electrode 722/733 (or electrode comprising 222/728, where layer 728 is an AFM oxide, or electrode comprising 722 or 733 with layer 728) is disposed on the drain contact 1018 of the transistor 1000.

In some embodiments, the MTJ memory device (e.g., which includes MTJ 221/721/821/831/841/851/861/871) includes individual functional layers that are described in association with FIGS. 2, and 7-8. In some embodiments, the spin orbit torque electrode 722/733 (or electrode comprising 222/728, where layer 728 is an AFM oxide, or electrode comprising 722 or 733 with layer 728) has a length, $L_{SOT}$ that is less than a distance of separation, LDS between the drain contact 1018 and the source contact 1016. In some embodiments, a portion of the spin orbit torque electrode 722/733 (or electrode comprising 222/728, where layer 728 is an AFM oxide, or electrode comprising 722 or 733 with layer 728) extends above the gate electrode 1012 and the gate contact 1014. In some embodiments, a portion of the spin orbit torque electrode 722/733 (or electrode comprising 222/728, where layer 728 is an AFM oxide, or electrode comprising 722 or 733 with layer 728) extends over the gate electrode 1012. In some embodiments, the spin orbit torque electrode 722/733 (or electrode comprising 222/728, where layer 728 is an AFM oxide, or electrode comprising 722 or 733 with layer 728) is in a first y-z plane as illustrated in FIG. 7A.

In some embodiments, the gate contact 1014 is directly below the spin orbit torque electrode 722/733 (or electrode comprising 222/728, where layer 728 is an AFM oxide, or electrode comprising 722 or 733 with layer 728). In some embodiments, a word-line (WL) contact 1070 is disposed onto the gate contact 1014 on a second y-z plane behind (into the page) the first y-z plane of the spin orbit torque electrode 222. In some embodiments, the spin orbit torque electrode 722/733 (or electrode comprising 222/728, where layer 728 is an AFM oxide, or electrode comprising 722 or 733 with layer 728) that may not contact the word-line contact is disposed on the gate electrode 1012.

In some embodiments, the transistor MN associated with substrate 1001 is a metal-oxide-semiconductor field-effect transistor (MOSFET or simply MOS transistors), fabricated on the substrate 1001. In various embodiments of the present disclosure, the transistor may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor is a tri-gate transistor.

In some embodiments, a voltage $V_{DS}$ is applied between the bit-line (BL) 1030 and the source-line (SL) 1040 and a word-line 1050 is energized above a threshold voltage, VTH on the transistor. In some embodiments, an electron current (spin hall current) flows through the spin orbit torque electrode 722/733 (or electrode comprising 222/728, where layer 728 is an AFM oxide, or electrode comprising 722 or 733 with layer 728) and causes a spin diffusion current to flow toward the MTJ memory device. The spin diffusion current exerts a torque on the magnetization of the free magnet 721aa/821aa of MTJ 221/721/821/831/841/851/861/871.

In some embodiments, by applying a voltage VDS between bit-line 1030 and source-line 1040, current can flow through the MTJ memory device of FIGS. 2, and 7-8. In some embodiments, a voltage VDS that is equal to or greater than the threshold voltage $V_{TS}$ is enough to generate spin polarized current through the MTJ 221/721/821/831/841/851/861/871. In some embodiments, the spin transfer torque current flowing through the MTJ 221 also imparts torque to the free magnet 221a/721aa//821aa adding to the torque from the spin diffusion current. In some embodiments, the combined effect of the spin transfer torque and the spin diffusion torque can switch the magnetization of the free magnet 221a/721aa//821aa. In some embodiments, by reversing the polarity of the voltage $V_{DS}$, and applying a voltage that meets or exceeds a threshold voltage, the direction of magnetization of the free magnet 221a/721aa//821aa is switched back to a previous configuration.

In some embodiments, by applying a voltage between a bit-line 1030 and source-line 1040, and by applying a voltage above a threshold voltage, VTH on the word-line 1050 of the transistor, the MTJ memory device FIGS. 2, and 7-8 can undergo magnetization switching without the need for an additional voltage source (e.g. a second transistor). In some embodiments, implementing an SOT memory device FIGS. 2, and 7-8 above a transistor can increase the number of SOT memory devices FIGS. 2, and 7-8 in a given area of a die by at least a factor of two.

In some embodiments, the underlying substrate 1001 represents a surface used to manufacture integrated circuits.

In some embodiments, the substrate 1001 includes a suitable semiconductor material such as but not limited to, single crystal silicon, polycrystalline silicon and silicon on insulator (SOI). In another embodiment, the substrate 1001 includes other semiconductor materials such as germanium, silicon germanium, or a suitable group III-V or group III-N compound. The substrate 1001 may also include semiconductor materials, metals, dopants, and other materials commonly found in semiconductor substrates.

In some embodiments, the transistor includes a gate stack formed of at least two layers, a gate dielectric layer 1010 and a gate electrode layer 1012. The gate dielectric layer 1010 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1010 to improve its quality when a high-k material is used.

The gate electrode layer 1012 of the transistor 700 is formed on the gate dielectric layer 1010 and may comprise of at least one P-type work-function metal or N-type work-function metal, depending on whether the transistor is to be a PMOS or an NMOS transistor. In some embodiments, the gate electrode layer 1012 may comprise of a stack of two or more metal layers, where one or more metal layers are work-function metal layers and at least one metal layer is a conductive fill layer.

For a PMOS transistor, metals that may be used for the gate electrode layer 1012 include, but are not limited to, ruthenium, palladium, platinum, cobalt, nickel, and conductive metal oxides, e.g., ruthenium oxide. A P-type metal layer will enable the formation of a PMOS gate electrode layer 1012 with a work-function that is between about 4.9 eV and about 5.2 eV. For an NMOS transistor, metals that may be used for the gate electrode layer 1012 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 1012 with a work-function that is between about 3.9 eV and about 4.2 eV.

In some embodiments, the gate electrode layer 1012 may comprise a "U"-shaped structure that includes a bottom portion substantially parallel to the surface of the substrate and two sidewall portions that are substantially perpendicular to the top surface of the substrate. In another embodiment, at least one of the metal layers that form the gate electrode layer 1012 may simply be a planar layer that is substantially parallel to the top surface of the substrate and does not include sidewall portions substantially perpendicular to the top surface of the substrate. In some embodiments of the present disclosure, the gate electrode layer 1012 may comprise of a combination of U-shaped structures and planar, non-U-shaped structures. For example, the gate electrode layer 1012 may comprise of one or more U-shaped metal layers formed atop one or more planar, non-U-shaped layers.

In some embodiments, a pair of gate dielectric layer 1010 may be formed on opposing sides of the gate stack that bracket the gate stack. The gate dielectric layer 1010 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 1002 and drain region 1004 are formed within the substrate adjacent to the gate stack of the transistor. The source region 1002 and drain region 1004 are generally formed using either an implantation/diffusion process or an etching/deposition process. In the former process, dopants such as boron, aluminum, antimony, phosphorous, or arsenic may be ion-implanted into the substrate to form the source region 1002 and drain region 1004. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 1002 and drain region 1004. In some embodiments, the source region 1002 and drain region 1004 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 1002 and drain region 1004 may be formed using one or more alternate semiconductor materials such as germanium or a suitable group III-V compound. In some embodiments, one or more layers of metal and/or metal alloys may be used to form the source region 1002 and drain region 1004.

In some embodiments, the gate contact 1014 and drain contact 1018 of the transistor 700 are disposed in a first dielectric layer 1020 disposed above the substrate 1001. In some embodiments, the spin orbit torque electrode 722/733 (or electrode comprising 222/728, where layer 728 is an AFM oxide, or electrode comprising 722 or 733 with layer 728) is disposed in a second dielectric layer 1022 disposed on the first dielectric layer 1020. In some embodiments, a third dielectric layer 1024 is disposed on the second dielectric layer 1022. In some embodiments, a fourth dielectric layer 1026 is disposed on the third dielectric layer 1024. In some embodiments, a source contact 1016 is partially disposed in the fourth dielectric layer 1026, partially disposed in the third dielectric layer 1024, partially disposed in the second dielectric layer 1022 and partially disposed on the first dielectric layer 1020. In some embodiments, the spin orbit torque electrode contact is disposed in the third dielectric layer 1024 on the spin orbit torque electrode 722/733 (or electrode comprising 222/728, where layer 728 is an AFM oxide, or electrode comprising 722 or 733 with layer 728). In some embodiments, the conductive interconnect structure such as conductive interconnect structure 1008A/B disposed in the fourth dielectric layer 1026.

The gate contact 1014 is formed in poly region; drain contact 1018 is formed in active, poly, and Metal 0 (M0); SOT or SHE electrode 222 is formed in Via 0-1 layer; MTJ MTJ 221/721/821/831/841/851/861/871 is formed in Metal 1 (M1) and Via 1-2; contract 708a is formed in Metal 2 (M2) and Via 2-3; and conductor 1008B is formed in Metal 3 (M3).

In some embodiments, the magnetic junction (e.g., MTJ 221/721/821/831/841/851/861/871 or spin valve) is formed in the metal 3 (M3) region. In some embodiments, the free magnet layer 221a of the magnetic junction 721/821/831/841/851/861/871 couples to electrode 722/733 (or electrode comprising 222/728, where layer 728 is an AFM oxide, or electrode comprising 722 or 733 with layer 728). In some embodiments, the fixed magnet layer 221c/821cc of magnetic junction 221/721/821/831/841/851/861/871 couples to the bit-line (BL) via electrode 722/733 (or electrode comprising 222/728, where layer 728 is an AFM oxide, or electrode comprising 722 or 733 with layer 728) through via 3-4 (e.g., via connecting metal 4 region to metal 4 (M4)). In this example embodiments, the bit-line is formed on M4.

In some embodiments, an n-type transistor MN is formed in the frontend of the die while the electrode 722/733 (or electrode comprising 222/728, where layer 728 is an AFM oxide, or electrode comprising 722 or 733 with layer 728) is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). In some embodiments, the electrode 722/733 (or electrode comprising 222/728, where layer 728 is an AFM oxide, or electrode comprising 722 or 733 with layer 728) is located in the backend metal layers or via layers for example in Via 3. In some embodiments, the electrical connectivity to the device is obtained in layers M0 and M4 or M1 and M5 or any set of two parallel interconnects. In some embodiments, the MTJ 221/721/821/831/841/851/861/871 is formed in metal 2 (M2) and metal 1 (M1) layer region and/or Via 1-2 region. In some embodiments, electrode 722/733 (or electrode comprising 222/728, where layer 728 is an AFM oxide, or electrode comprising 722 or 733 with layer 728) is formed in the metal 1 region.

FIG. 11 illustrates flowchart 1100 of a method for forming a device of FIGS. 2, and 7-8, in accordance with some embodiments. While the following blocks (or process operations) in the flowchart are arranged in a certain order, the order can be changed. In some embodiments, some blocks can be executed in parallel.

In some embodiments, an apparatus is formed having a magnetic junction adjacent to a spin orbit interconnect. In some embodiments, the magnetic junction is one of a spin valve or an MTJ. The method for forming the apparatus comprises forming a stack of structures including forming a first structure 221 as indicated by block 1101, a second structure 221b as indicated by block 1102, and a third structure 221c as indicated by block 1103.

At block 1101, first structure 221a is fabricated comprising a magnet with an unfixed perpendicular magnetic anisotropy (PMA) relative to an x-y plane of a device, wherein the first structure has a first dimension along the x-y plane and a second dimension in the z-plane, wherein the second dimension is substantially greater than the first dimension. In some embodiments, the first dimension is in a range of 5 to 20 nanometers, and wherein the second dimension is in a range of 10 to 50 nanometers. In some embodiments, the first dimension is a radius of the first structure. In some embodiments, the magnet of the first structure is a paramagnet which includes one or more of: Pt, Pd, W, Ce, Al, Li, Mg, Na, Cr, Co, Dy, O, Er, Eu, Eu, Gd, Fe, Nd, K, Pr, Sm, Tb, Tm, or V, or wherein the magnet of the first structure is a paramagnet which comprises dopants which include one or more of: Ce, Cr, Mn, Nb, Mo, Tc, Re, Nd, Gd, Tb, Dy, Ho, Er, Tm, or Yb.

At block 1102, second structure 221b is fabricated comprising one of a dielectric or metal. In some embodiments, the dielectric comprises: Mg and O.

At block 1103, third structure 221c is formed comprising a magnet with fixed PMA, wherein the third structure has an anisotropy axis perpendicular to the plane of the device, and wherein the third structure is adjacent to the second structure such that the second structure is between the first and third structures. In some embodiments, the first or third structures comprises a stack including a first material (e.g., $821aa_1$) and a second material (e.g., $821ab_1$) different from the first material. In some embodiments, the first material includes one of: Co, Ni, Fe, or a Heusler alloy. In some embodiments, the Heusler alloy includes one or more of Co, Cu, Fe, Ga, Ge, In, Mn, Al, In, Sb, Si, Sn, Ni, Pd, Ru, or V. In some embodiments, the second material includes one of: Pt, Pd, Ir, Ru, or Ni, where the first material has a thickness in a range of 0.6 nm to 2 nm, and wherein the second material has a thickness in a range of 0.1 nm to 3 nm.

In some embodiments, the first or the third structures comprises a super lattice including a first material (e.g., $821aa_1$) and a second material (e.g., $821ab_1$), wherein the first material includes one of: Co, Ni, Fe, or Heusler alloy; and wherein the second material includes one of: Pt, Pd, Ir, Ru, or Ni.

In some embodiments, the method comprises forming a fourth structure (e.g., 726) adjacent to the interconnect 222/722/733 such that the first and fourth structures are on opposite surfaces of the interconnect, wherein the fourth structure comprises a magnet with in-plane magnetization relative to the x-y plane of the device. In some embodiments, forming the magnetic junction comprises: forming a fifth structure between the first (e.g., 721aa) and second structures, wherein the fifth structure includes one or more of: Ru, Os, Hs, or Fe; or forming a sixth structure between the second and third structures, wherein the sixth structure includes one or more of: Ru, Os, Hs, or Fe.

In some embodiments, forming the magnetic junction comprises: forming a seventh structure (e.g., 727) between the interconnect and the fourth structure, wherein the seventh structure includes an AFM material, and wherein the interconnect comprises a spin orbit material. In some embodiments, the AFM material includes one of: Ir, Pt, Mn, Pd, or Fe. In some embodiments, the AFM material is a quasi-two-dimensional triangular AFM including $Ni_{(1-x)}M_xGa_2S_4$, where 'M' includes one of: Mn, Fe, Co or Zn.

At block 1104, interconnect 722/733 (or electrode comprising 222/728, where layer 728 is an AFM oxide, or electrode comprising 722 or 733 with layer 728) is formed adjacent to the third structure, wherein the interconnect comprises a spin orbit material. In some embodiments, the spin orbit material includes an antiferromagnetic (AFM) material which is doped with a doping material. In some embodiments, the doping material includes one or more of: Pt, Ni, Co, or Cr.

In some embodiments, the interconnect includes one or more or: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

In some embodiments, the interconnect comprises a spin orbit material which includes one of: a 2D material, a 3D material, an AFM material, or an AFM material doped with a doping material. In some embodiments, the 3D material is thinner than the 2D material. In some embodiments, the doping material includes one of: Co, Fe, Ni, Mn, Ga, Fe, or Bct-Ru. In some embodiments, the interconnect comprises a stack of layers, wherein one of the layer in the stack comprises an AFM material.

Figure 12:
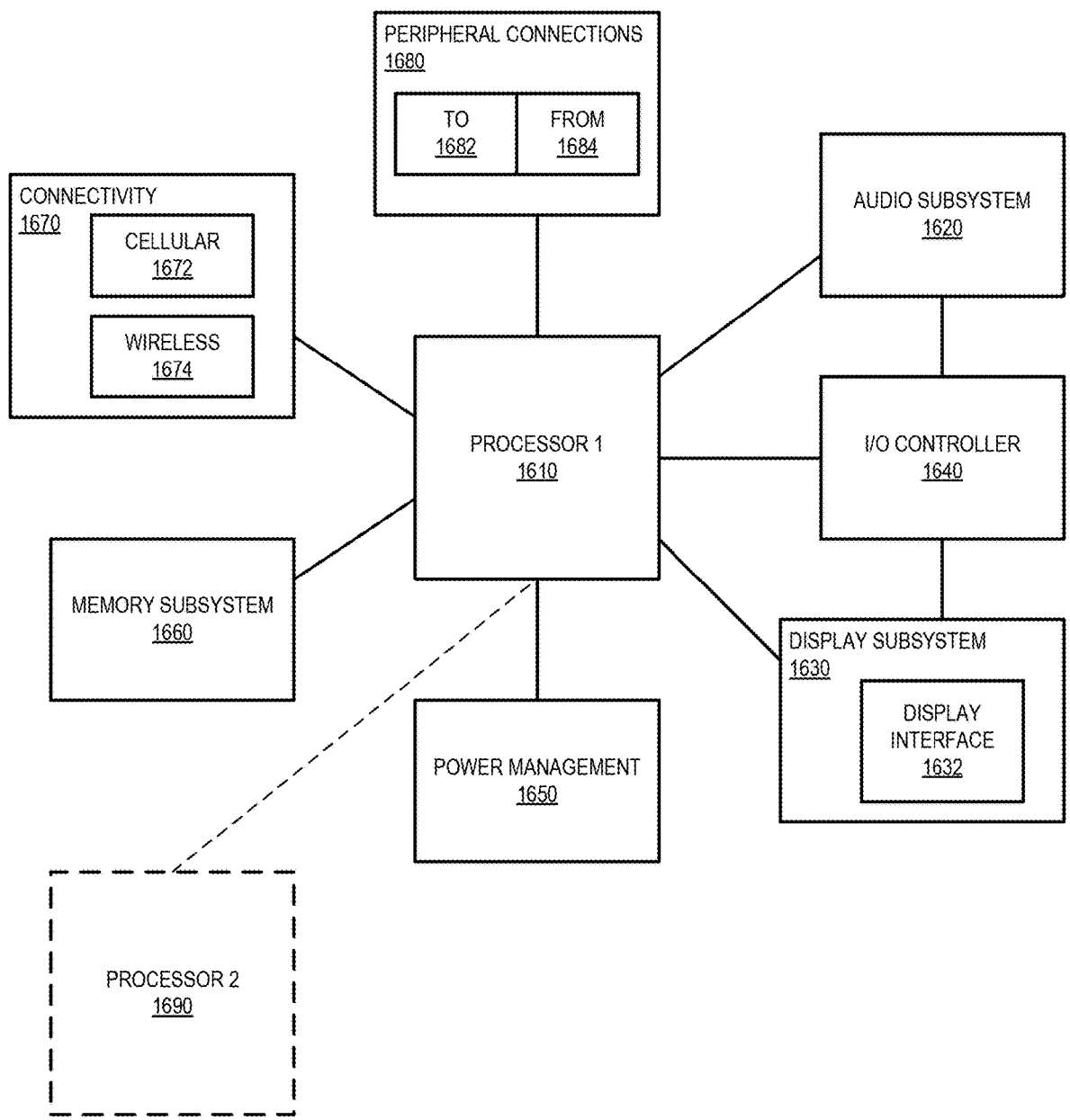
FIG. 12 illustrates a smart device or a computer system or an SoC (System-on-Chip) with a magnetic junction based memory comprising a nano-rod where the free magnet has a thickness substantially greater than a width of the free magnet, according to some embodiments of the disclosure.

FIG. 12 illustrates a smart device or a computer system or a SoC (System-on-Chip) with a magnetic junction based memory having a via for dipole and exchange coupling in the SOT/AFM interconnect, where the free magnet has a thickness substantially greater than a width of the free magnet, according to some embodiments of the disclosure.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with one or more devices according to any one of devices of FIGS. 2, and 7-8, according to some embodiments discussed. Other blocks of the computing device 1600 may also include one or more devices according to any one of devices of FIGS. 2, and 7-8, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a magnetic junction including:
   a stack of structures including:
   a first structure comprising a magnet with an unfixed perpendicular magnetic anisotropy (PMA) relative to an x-y plane of a device, wherein the first structure has a first dimension along the x-y plane and a second dimension in a z-plane, wherein the second dimension is substantially greater than the first dimension;
a second structure comprising one of a dielectric or metal; and
a third structure comprising a magnet with fixed PMA, wherein the third structure has an anisotropy axis perpendicular to the plane of the device, and
wherein the third structure is adjacent to the second structure such that the second structure is between the first and third structures; and
an interconnect adjacent to the first structure, wherein the interconnect comprises a spin orbit material.

2. The apparatus of claim 1, wherein the first dimension is in a range of 5 to 20 nanometers, and wherein the second dimension is in a range of 10 to 50 nanometers.

3. The apparatus of claim 1, wherein the first dimension is a radius of the first structure.

4. The apparatus of claim 1, wherein the spin orbit material includes an antiferromagnetic (AFM) material which is doped with a doping material.

5. The apparatus of claim 4, wherein the doping material includes one or more of: Pt, Ni, Co, or Cr.

6. The apparatus of claim 1 comprises a fourth structure adjacent to the interconnect such that the third and fourth structures are on opposite surfaces of the interconnect, wherein the fourth structure comprises a magnet with in-plane magnetization relative to the x-y plane of the device.

7. The apparatus of claim 1, wherein the magnetic junction comprises:
a fifth structure between the first and second structures, wherein the fifth structure includes one or more of: Ru, Os, Hs, or Fe; or
a sixth structure between the second and third structures, wherein the sixth structure includes one or more of: Ru, Os, Hs, or Fe.

8. The apparatus of claim 1, comprises: a seventh structure between the interconnect and the fourth structure, wherein the seventh structure includes an AFM material, and wherein the interconnect comprises a spin orbit material.

9. The apparatus of claim 8, wherein the AFM material includes one of: Ir, Pt, Mn, Pd, or Fe.

10. The apparatus of claim 8, wherein the AFM material is a quasi-two-dimensional triangular AFM including $Ni_{(1-x)}M_xGa_2S_4$, where 'M' includes one of: Mn, Fe, Co or Zn.

11. The apparatus of claim 1, wherein:
the first or third structures comprises a stack including a first material and a second material different from the first material;
the first material includes one of: Co, Ni, Fe, or a Heusler alloy;
the Heusler alloy includes one or more of Co, Cu, Fe, Ga, Ge, In, Mn, Al, In, Sb, Si, Sn, Ni, Pd, Ru, or V;
the second material includes one of: Pt, Pd, Ir, Ru, or Ni; and
wherein the first material has a thickness in a range of 0.6 nm to 2 nm, and wherein the second material has a thickness in a range of 0.1 nm to 3 nm.

12. The apparatus of claim 1, wherein the dielectric comprises: Mg and O.

13. The apparatus of claim 1, wherein the first or the third structures comprises a super lattice including a first material and a second material, wherein the first material includes one of: Co, Ni, Fe, or Heusler alloy; and wherein the second material includes one of: Pt, Pd, Jr, Ru, or Ni.

14. The apparatus of claim 1, wherein the interconnect includes one or more or: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Jr, Mn, Pd, or Fe.

15. The apparatus of claim 1, wherein:
the interconnect comprises a spin orbit material which includes one of: a 2D material, a 3D material, an AFM material, or an AFM material doped with a doping material;
the 3D material is thinner than the 2D material; and
the doping material includes one of: Co, Fe, Ni, Mn, Ga, Fe, or Bct-Ru.

16. The apparatus of claim 1, wherein the interconnect comprises a stack of layers, wherein one of the layers in the stack comprises an AFM material.

17. The apparatus of claim 1, wherein the magnetic junction is one of a spin valve or a magnetic tunneling junction (MTJ).

18. The apparatus of claim 1, wherein the magnet of the first structure is a paramagnet which includes one or more of: Pt, Pd, W, Ce, Al, Li, Mg, Na, Cr, Co, Dy, O, Er, Eu, Eu, Gd, Fe, Nd, K, Pr, Sm, Tb, Tm, or V.

19. The apparatus of claim 1, wherein the magnet of the first structure is a paramagnet which comprises dopants which include one or more of: Ce, Cr, Mn, Nb, Mo, Tc, Re, Nd, Gd, Tb, Dy, Ho, Er, Tm, or Yb.

20. A system comprising:
a memory;
a processor coupled to the memory, the processor having a magnetic memory, which comprises:
a magnetic junction having a magnet with a first magnetization, wherein the magnetic junction comprises a structure having a first dimension along an x-y plane and a second dimension in a z-plane of a device, wherein the second dimension is substantially greater than the first dimension;
an interconnect adjacent to the structure of the magnetic junction, wherein the interconnect comprises a spin orbit material; and
a structure adjacent to the interconnect such that the magnetic junction and the structure are on opposite surfaces of the interconnect, wherein the structure comprises a magnet with a second magnetization substantially different from the first magnetization; and
a wireless interface to allow the processor to communicate with another device.

21. The system of claim 20, wherein the first dimension is in a range of 5 to 20 nanometers, and wherein the second dimension is in a range of 10 to 50 nanometers.

22. An apparatus comprising:
a magnetic junction having a magnet with a first magnetization, wherein the magnetic junction comprises a structure having a first dimension along an x-y plane and a second dimension in a z-plane of a device, wherein the second dimension is substantially greater than the first dimension;
an interconnect adjacent to the magnetic junction, wherein the interconnect comprises spin orbit material; and
a structure adjacent to the interconnect such that the magnetic junction and the structure are on opposite surfaces of the interconnect, wherein the structure comprises a magnet with a second magnetization substantially different from the first magnetization.

23. The apparatus of claim 22, wherein the first dimension is in a range of 5 to 20 nanometers, and wherein the second dimension is in a range of 10 to 50 nanometers.

* * * * *